(12) United States Patent
Aboueldahab et al.

(10) Patent No.: US 11,855,532 B2
(45) Date of Patent: Dec. 26, 2023

(54) STARTUP DETECTION FOR PARALLEL POWER CONVERTERS

(71) Applicant: pSemi Corporation, San Diego, CA (US)

(72) Inventors: Walid Fouad Mohamed Aboueldahab, Wokingham (GB); Aichen Low, Cambridge, MA (US)

(73) Assignee: pSemi Corporation, San Diego, CA (US)

( * ) Notice: Subject to any disclaimer, the term of this patent is extended or adjusted under 35 U.S.C. 154(b) by 0 days.

(21) Appl. No.: 17/901,479

(22) Filed: Sep. 1, 2022

(65) Prior Publication Data

US 2023/0070219 A1 Mar. 9, 2023

Related U.S. Application Data

(63) Continuation of application No. PCT/US2021/020468, filed on Mar. 2, 2021, which is a continuation of application No. 16/807,753, filed on Mar. 3, 2020, now Pat. No. 10,992,226.

(51) Int. Cl.
*H02M 3/07* (2006.01)

(52) U.S. Cl.
CPC ............ *H02M 3/073* (2013.01); *H02M 3/077* (2021.05)

(58) Field of Classification Search
None
See application file for complete search history.

(56) References Cited

U.S. PATENT DOCUMENTS

| 6,812,776 | B2 | 11/2004 | Henry |
| 7,663,960 | B2 | 2/2010 | Suzuki |
| 8,120,411 | B1 | 2/2012 | Liu |
| 8,462,578 | B2 | 6/2013 | Neto et al. |
| 9,473,073 | B2 | 10/2016 | Liu et al. |
| 9,634,560 | B2 | 4/2017 | Ek |
| 10,103,632 | B2 * | 10/2018 | Nien .................. H02M 3/1584 |

(Continued)

OTHER PUBLICATIONS

Low, et al., "Startup of Switched Capacitor Step-Down Power Converter", patent application as filed in the USPTO on Feb. 14, 2020, U.S. Appl. No. 16/791,866, 83 pgs.

(Continued)

*Primary Examiner* — Jeffery S Zweizig
(74) *Attorney, Agent, or Firm* — JAQUEZ LAND GREENHAUS & MCFARLAND LLP; John Land, Esq.

(57) ABSTRACT

Circuits/methods for controlling the startup of multiple parallel power converters that avoid inrush current or switch overstress in an added power converter or a power converter having fault conditions. Embodiments include node status detectors coupled to nodes within parallel-connected power converters to monitor voltage/current and configured in some embodiments to work in parallel with an output status detector measuring the startup output voltage of a power converter. With charge pump-based power converters, the node status detectors ensure that the power converter pump capacitors are charged while the output capacitor is charged as well. For such embodiments, a softstart period of startup may be considered finished if both the shared output capacitors and the power converter pump capacitors are charged to target values. Embodiments may also be used for fault detection during steady-state operation.

17 Claims, 13 Drawing Sheets

(56) References Cited

U.S. PATENT DOCUMENTS

| | | | |
|---|---|---|---|
| 10,263,514 | B1 | 4/2019 | Aboueldahab |
| 10,498,241 | B2* | 12/2019 | Wu .......................... H02M 1/08 |
| 10,992,226 | B1 | 4/2021 | Aboueldahab et al. |
| 2009/0072800 | A1 | 3/2009 | Ramadass et al. |
| 2013/0234785 | A1 | 9/2013 | Dai et al. |
| 2016/0116925 | A1 | 4/2016 | Freeman et al. |
| 2016/0234895 | A1 | 8/2016 | Delos Ayllon et al. |
| 2018/0097444 | A1 | 4/2018 | Low et al. |
| 2019/0296630 | A1 | 9/2019 | Low et al. |

OTHER PUBLICATIONS

Jaunay, et al., "DC-to-DC Design Guide", Viashy Siliconix, AN607, Document No. 71917, Oct. 2, 2010, pp. 1-23.

Zanchi, Brian, "Shared Comparator for Charge Pumps", patent application as filed in the USPTO on Dec. 9, 2019, U.S. Appl. No. 16/708,112, 44 pgs.

Routledge, Antony, "In-Rush Current Protected Power Converter", patent application as filed in the USPTO on Feb. 6, 2020, U.S. Appl. No. 16/783,800, 36 pgs.

Patel, Rajnikant B., Office Action received from the USPTO dated Sep. 10, 2018 for U.S. Appl. No. 15/920,327, 10 pgs.

Patel, Rajnikant B., Notice of Allowance received from the USPTO dated Feb. 11, 2019 for U.S. Appl. No. 15/920,327, 10 pgs.

Ng, et al., "Switched Capacitor DC-DC Converter: Superior where the Buck Converter has Dominated", Electrical Engineering and Computer Sciences, University of California at Berkeley, Technical Report No. UCB/EECS-2011-94, http://www.eecs.berkeley.edu/Pubs/TechRpts/2011/EECS-2011-94.html, Aug. 17, 2011, pp. 8-11 (141 pgs).

Paul, et al., "High Voltage Switching Device", U.S. Patent Application filed in the USPTO on Dec. 5, 2017, U.S. Appl. No. 15/832,626, 42 pgs.

Kim, Jung H., Office Action received from the USPTO dated Nov. 18, 2020 for U.S. Appl. No. 16/807,753, 15 pgs.

Kim, Jung H., Notice of Allowance received from the USPTO dated Mar. 10, 2021 for U.S. Appl. No. 16/807,753, 7 pgs.

Van Der Meer, Paul, International Search Report and Written Opinion received from the EPO dated Jun. 10, 2021 for appln. No. PCT/US2021/020468, 12 pgs.

Van Der Meer, Paul, International Report on Patentability received from the EPO dated Jun. 9, 2022 for appln. No. PCT/US2021/020468, 34 pgs.

Weinstein, et al., "Plug-and-play Digital Controllers for Scalable Low-Power SMPS", Control and Modeling for Power Electronics, 2008, Compel 2008, 11th Workshop on, IEEE, Aug. 17, 2008, pp. 1-6.

Cornea, et al., "Interleaved 3 Phase DC/DC Converter for Automotive Applications", Optimization of Electrical and Electronic Equipment (OPTIM), 2010, 12th International Conference on, IEEE, May 20, 2010, pp. 589-594.

\* cited by examiner

STARTUP DETECTION FOR PARALLEL POWER CONVERTERS

CROSS-REFERENCE TO RELATED APPLICATIONS

The present application is a continuation of PCT Patent Application No. PCT/US2021/020468, filed on Mar. 2, 2021 and titled "Startup Detection for Parallel Power Converters," which is herein incorporated by reference in its entirety and which, in turn, claims priority to U.S. patent application Ser. No. 16/807,753, filed on Mar. 3, 2020 and titled "Startup Detection for Parallel Power Converters,", now U.S. Pat. No. 10,992,226, issued Apr. 27, 2021 which is herein incorporated by reference in its entirety. This invention may also be related to the following patent applications and patents, all assigned to the assignee of the present invention, the contents of all of which are incorporated by reference:

- U.S. patent application Ser. No. 16/791,866, filed Feb. 14, 2020, entitled "Startup of Switched Capacitor Step-Down Power Converter", which claims priority to U.S. Provisional Patent Application Ser. No. 62/971,094, filed Feb. 6, 2020, entitled "Startup of Switched Capacitor Step-Down Power Converter";
- U.S. patent application Ser. No. 16/708,112, filed Dec. 9, 2019, entitled "Shared Comparator for Charge Pumps";
- U.S. patent application Ser. No. 16/783,800, filed Feb. 6, 2020, entitled "In-Rush Current Protected Power Converter"; and
- U.S. Pat. No. 10,263,514, issued Apr. 16, 2019, entitled "Selectable Conversion Ratio DC-DC Converter".

BACKGROUND

(1) Technical Field

This invention relates to electronic circuits, and more particularly to power converter circuits.

(2) Background

Many electronic products, particularly mobile computing and/or communication products and components (e.g., notebook computers, ultra-book computers, tablet devices, LCD and LED displays) require multiple voltage levels. For example, radio frequency transmitter power amplifiers may require relatively high voltages (e.g., 12V or more), whereas logic circuitry may require a low voltage level (e.g., 1-2V). Still other circuitry may require an intermediate voltage level (e.g., 5-10V).

Power converters are often used to generate a lower or higher voltage from a common power source, such as a battery. Power converters which generate a lower output voltage (e.g., $V_{OUT}$) level from a higher input voltage (e.g., $V_{IN}$) power source are commonly known as step-down or buck converters, so-called because $V_{OUT} < V_{IN}$, and hence the converter is "bucking" the input voltage. Power converters which generate a higher output voltage level from a lower input voltage power source are commonly known as step-up or boost converters, because $V_{OUT} > V_{IN}$. In many embodiments, a power converter may be bi-directional, being either a step-up or a step-down converter depending on how a power source is connected to the converter.

FIG. 1A is a block diagram of a circuit that includes a prior art power converter 100. In the illustrated example, the power converter 100 includes a converter circuit 102 and a controller 104. The converter circuit 102 is configured to receive an input voltage $V_{IN}$ from a voltage source 106 across terminals V1+, V1−, and transform the input voltage $V_{IN}$ into an output voltage $V_{OUT}$ across terminals V2+, V2−. The output voltage $V_{OUT}$ is generally coupled across an output capacitor $C_{OUT}$, across which may be connected a load 108. In some embodiments of the power converter 100, auxiliary circuitry (not shown), such as a bias voltage generator(s), a clock generator, a voltage control circuit, etc., may also be present and coupled to the converter circuit 102 and the controller 104.

FIG. 1B is a block diagram of a circuit that includes a more detailed embodiment of an instance of the prior art power converter 100 of FIG. 1A. The illustrated converter circuit 102 includes a charge pump 120. As used in this disclosure, the term "charge pump" refers to a switched-capacitor network configured to boost or buck $V_{IN}$ to $V_{OUT}$. Examples of charge pumps include cascade multiplier, Dickson, Ladder, Series-Parallel, Fibonacci, and Doubler switched-capacitor networks, all of which may be configured as a multi-phase or a single-phase network. A power converter 100 based on a charge pump uses capacitors (not shown in FIG. 1B) to transfer charge from the input to the output of the power converter 100. These charge transfer capacitors are commonly known as "fly capacitors" or "pump capacitors", and may be external components coupled to an integrated circuit embodiment of the power converter 100.

In the illustrated example, the charge pump 120 is coupled to $V_{OUT}$ through a voltage regulator 140. As is known in the art, a voltage regulator is a circuit designed to automatically maintain a constant voltage level, and commonly comprises an inductor-based switching regulator. FIG. 1C a schematic diagram of an embodiment of a prior art voltage regulator 140 having an inductor L and controller 142 to control various switches Sx within the voltage regulator 140. Details of operation of the illustrated voltage regulator 140 may be found in the patent application referenced above entitled "Startup of Switched Capacitor Step-Down Power Converter". The voltage regulator 140 may operate autonomously, or may be controlled by the controller 104 through a control signal path 114 to enable, disable, and/or reconfigure the voltage regulator 140.

Optionally, an immediate capacitor $C_{VX}$ may be coupled across the immediate output terminals v2+, v2− of the charge pump 120 before the voltage regulator 140, for example, if noise/EMI needs to be filtered or if there exists circuitry powered off of the immediate output, $V_X$, of the charge pump 120. The capacitance of the intermediate capacitor $C_{VX}$ generally would be set to be much smaller than the capacitance of the output capacitor $C_{OUT}$ and smaller than the capacitance of the charge pump capacitors described below.

In a first alternative embodiment, the immediate output terminals v2+, v2− of the charge pump 120 are the outputs V2+, V2− of the converter circuit 102 and are coupled through an inductor (not shown in FIG. 1B) to the output capacitor $C_{OUT}$ and the load 108 (i.e., the voltage regulator 140 is omitted but the intermediate capacitor $C_{VX}$ is retained). In a second alternative embodiment, the immediate output terminals v2+, v2− of the charge pump 120 are the outputs V2+, V2− of the converter circuit 102 and are coupled directly to the output capacitor $C_{OUT}$ and the load 108 (i.e., the voltage regulator 140 and the intermediate capacitor $C_{VX}$ are both omitted).

In an alternative embodiment of the converter circuit 102, the voltage regulator 140 directly receives an input voltage $V_{IN}$ from a voltage source 106 across its terminals v1+, v1− (i.e., the charge pump 120 and the intermediate capacitor $C_{VX}$ are omitted).

Referring again to FIG. 1A, the controller 104 receives a set of input signals and produces a set of output signals. Some of these input signals arrive along a signal path 110 connected to the converter circuit 102. These input signals carry information that is indicative of the operational state of the converter circuit 102. The controller 104 also receives at least a clock signal CLK and one or more external input/output signals I/O that may be analog, digital, or a combination of both. Based upon the received input signals, the controller 104 produces a set of control signals back to the converter circuit 102 on the signal path 110 that control the internal components of the converter circuit 102 (e.g., internal switches, such as low voltage FETs, especially MOSFETs) to cause the converter circuit 102 to boost or buck $V_{IN}$ to $V_{OUT}$. In some embodiments, an auxiliary circuit (not shown) may provide various signals to the controller 104 (and optionally directly to the converter circuit 102), such as the clock signal CLK, the input/output signals I/O, as well as various voltages, such as a general supply voltage $V_{DD}$ and a transistor bias voltage $V_{BIAS}$. As in FIG. 1B, an additional control signal path 114 may control a voltage regulator 140 if present.

In general, a power converter 100 will operate in one of three distinct states: a steady-state, a shutdown state, and a startup state. During the steady-state or "normal" operation state, the power converter 100 receives an input voltage $V_{IN}$ and transforms it into an output voltage $V_{OUT}$. In this steady-state or "normal" operation state, the power converter 100 is expected to be able to deliver up to full output power as demanded by the load 108. In the shutdown state, the power converter 100 is disabled and no voltage transformation or power delivery occurs. In the startup state, circuit activity within the power converter 100 is enabled to eventually transfer energy from the voltage source at the input to the output voltage in a limited or reduced power delivery manner—that is, to transition from the shutdown state to steady-state operation.

Similarly, the charge pump 120 of a power converter 100 will operate in one of three distinct states: a steady-state, a shutdown state, and a startup state. During the steady-state or "normal" operation state, such a charge pump 120 receives an input voltage $V_{IN}$ and transforms it, by switching connections of the pump capacitors between two clock phases, into an immediate output voltage $V_X$, or into an ultimate output voltage $V_{OUT}$, depending on the configuration of the power converter 100. In the steady-state or "normal" operation state, the charge pump 120 is expected to be able to deliver up to full output power as demanded by the load 108. In the shutdown state, there is no charge pump switching activity. In the startup state, circuit activity is enabled to eventually cause the charge pump 120 to begin switching in order to transfer charge from the voltage source at the input to the output voltage using the pump capacitors in a limited or reduced power delivery manner—that is, to transition from the shutdown state to steady-state operation. In this startup state, the pump capacitors and output capacitors are pre-charged to the voltage levels expected at the steady-state.

During a startup state, a power converter 100 based on a charge pump 120 needs to both align the voltages on the pump capacitors relative to the $V_{OUT}$ voltage at the output capacitor $C_{OUT}$ and bring up the $V_{OUT}$ voltage to a desired level close enough to a steady-state target voltage before the charge pump 120 is ready to transition to steady-state operation. The startup state may include a pre-switching period in which some circuitry in the charge pump 120 is active but charge pump switching is disabled (where charge pump switching is defined as applying clock waveforms as generated by the controller 104 to control internal operations in the charge pump 120), and a subsequent switching period in which charge pump switching is enabled but in a reduced power delivery mode with limited supply current.

Most of the time, the charge pump 120 in the power converter 100 will start with all capacitors (the pump capacitors and the output capacitor $C_{OUT}$) fully discharged, which is considered a "balanced" condition. Otherwise, particularly for step-down buck converters, it may be necessary to rebalance the voltage on the pump capacitors relative to voltage on the output capacitor $C_{OUT}$ before switching begins in order to prevent excessive in-rush current and/or switch over-stress. Rebalancing involves setting the voltage across each of the pump capacitors to approximate target multiples of the voltage $V_{OUT}$ across the output capacitor $C_{OUT}$ by discharging and/or precharging the pump capacitors, either simultaneously or sequentially, before the start of charge pump switching operation. If voltage balancer circuitry is implemented, such as taught in the incorporated patent "Startup of Switched Capacitor Step-Down Power Converter" referenced above, the charge pumps 120 generally will robustly startup into a wide variety of initial conditions that are considered "unbalanced". In some embodiments, a startup status detector (not shown) may be used to measure $V_{OUT}$ and provide an output flag signal (e.g., a signal line that transitions from a logic "0" to a logic "1") when a desired output voltage condition is satisfied. The output flag signal may be taken into account as one required condition before enabling full power steady-state operation of the charge pump 102 (noting the other conditions may also be required to enable full power steady-state operation of the charge pump 102).

For applications where higher output power is desired, multiple power converters 100 can be coupled in parallel to deliver a higher load current. Yet other applications (e.g., energy harvesting) may couple multiple power converters 100 in parallel, comprising either similar or different instances of power converter 100 as needed, to meet a wider variety of output requirements under different or varying operating conditions. For example, FIG. 2 is a block diagram of a circuit 200 that includes multiple parallel-connected prior art power converters $100\_1 \ldots 100n$, where n>1. In this example, an input voltage $V_{IN}\_x$ is applied to each of the n power converters $100\_x$, each of which generates a corresponding output voltage $V_{OUT}\_x$ across respective output capacitors $C_{OUT}\_x$ when enabled for operation. The $V_{IN}\_x$ inputs to the power converters $100\_x$ may come from different voltage sources, or may be shared across one or more of the power converters $100\_x$. For example, all of the inputs to the power converters $100x$ may be connected together to a single voltage source, as illustrated by the dotted line connecting $V_{IN\_1}$ to $V_{IN\_n}$.

In the illustrated example, the $V_{OUT}\_x$ outputs of the power converters $100\_x$ are shared (i.e., directly connected together at a load node LN), without inserting extra isolation switches in series between the respective $V_{OUT}\_x$ outputs of the power converters $100\_x$ and the load node LN. Such isolation switches increase circuit size and complexity, while potentially degrading steady-state performance. However, during startup with power converters $100\_1 \ldots 100\_n$ in direct-connected parallel (i.e., no series switches between the $V_{OUT}$ outputs and the load node LN), potential problems can occur that can lead to excessive in-rush current and/or switch over-stress within one or more of the power converters 100_x.

As one example, the case may be that all power converters 100_x startup concurrently but one or more of the power converters 100_x has at least one or more fault events, such as a faulty pump capacitor (e.g., an external pump capacitor may not be properly soldered to a circuit board bearing an integrated circuit embodiment of an associated power converter 100). During the startup state, the voltage at the load node LN is charged by healthy power converters 100_x towards the desired steady-state value of $V_{OUT}$. A startup status detector (not shown) coupled to the $V_{OUT}$_x of a respective power converter 100_x—including the faulty power converter(s)—would detect when the shared $V_{OUT}$ voltage reaches an adequate level and provide an output flag signal to the associated power converter 100_x, thereby enabling full power steady-state operation prematurely. This can lead to large in-rush currents and/or switch over-stress within the already faulty power converter(s).

As another example, in some embodiments, the power converters 100_x may not be started up concurrently, but in some sequence (including randomly). Thus, at least one of the power converters 100_x will be started up and added to the set of enabled power converters 100_x when the shared voltage at the load node LN is already at or near the full value of $V_{OUT}$. A startup status detector for the added power converter 100_x would sense the shared $V_{OUT}$ voltage and provide an output flag signal to the associated power converter 100_x, thereby prematurely enabling full power steady-state operation. If the added power converter 100_x includes a charge pump 120, premature enabling of full power steady-state operation may occur before the voltages on the pump capacitors of the power converter 100_x are sufficiently aligned with the $V_{OUT}$ voltage. Again, this condition can lead to high in-rush currents and switch over-stress within the charge pump 120 of the added power converter 100_x.

Similar problems may occur where differences exist between the power converters 100_x (which need not have identical circuitry for their respective converter circuits 102), such as capacitor or inductor values, startup timing offsets, mismatches between multiple startup status detectors, etc. Even if the power converters 100_x are not subject to a fault event and are started up exactly concurrently, differences or offsets may cause one power converter to bring the shared $V_{OUT}$ voltage up more rapidly than another. The "slower" power converter(s) will tend to shunt current away from the directly coupled outputs while the "faster" power converter(s) are trying to prop it up, leading to increased thermal dissipation and power waste. Furthermore, mismatches between the startup status detectors amongst the paralleled power converters 100_x may cause a power converter 100_x with a lower-threshold startup status detector to transition to full power steady state operation sooner than one with a higher-threshold startup status detector. This increases the possibility of further thermal dissipation and power waste, while potentially causing the "slower" power converter(s) to prematurely transition to full power steady-state operation.

Accordingly, there is a need for controlling the startup of multiple parallel power converters 100_x having directly coupled outputs that avoids the problems noted above, in order to minimize or prevent excessive in-rush current, switch over-stress within a power converter, and thermal dissipation. The present invention addresses this need and provides a number of benefits.

SUMMARY

The present invention encompasses circuits and methods for controlling the startup of multiple parallel power converters having directly coupled outputs that, among other things, prevents premature steady-state operation by any or all of the parallel power converters in order to avoid or minimize issues such as excessive in-rush current, switch over-stress within a power converter, and/or thermal dissipation.

One aspect of embodiments of the present invention is the introduction of node status detectors coupled to selected nodes within some or all parallel-connected power converters to monitor voltage and/or current, and configured in some embodiments to work in parallel with an output status detector measuring the output voltage (e.g., $V_{OUT}$ and/or $V_X$) of an associated power converter during startup. For power converters that include a charge pump, the node status detectors ensure that the pump capacitors of each power converter are being adequately charged while the output capacitor $C_{OUT}$ is charged as well. In such embodiments, a soft-start period of startup may be considered finished if both the shared output capacitors and the pump capacitors of each power converter are charged to a selected percentage of the target steady-state values.

In general, a node status detector is coupled to one or more internal nodes of an associated power converter to measure a voltage and/or current at such nodes to determine if the pump capacitors of the power converter are adequately charged during the soft-start period. In addition, an output status detector is coupled to the output voltage of an associated power converter to measure the output voltage to determine if the output capacitor $C_{OUT}$ is adequately charged during the soft-start period.

The node status detectors are configured to generate one or more node flag signals if the measured voltage(s) or current(s) at the internal node(s) is sufficient to allow startup to proceed through to full power steady-state operation. Similarly, the output status detectors are configured to generate an output flag signal if the measured output voltage is sufficient to allow startup to proceed through to full power steady-state operation. The output and node flag signals are coupled to an associated status validation circuit that generates a logic StartUpOK signal (e.g., a binary "1") only if all of the flag signals from the node status detector and the output status detector have been asserted, indicating that the shared output capacitors $C_{OUT}$ and the pump capacitors of each power converter are charged to a selected percentage of the target steady-state values. Each StartUpOK signal may be coupled to an associated power converter and, when asserted, may be taken into account as one required condition before enabling the associated power converter to complete the startup state and proceed through to full power steady-state operation.

The criteria for assertion of the StartUpOK signal by a status validation circuit based on the received flag signal(s) from the node status detectors and output status detectors may include (but not be limited to) whether the output voltage of an associated power converter was within a predefined tolerance value of its regulation target value (usually looser than the steady-state accuracy), whether or not other faults occurred during soft-start period, and/or whether converter internal node voltages or currents are within expected targets. Furthermore, the StartUpOK signal from each power converter in a system of multiple direct-connected parallel power converters may be coupled to a system status validation circuit that generates a logic Sys- StartUpOK signal (e.g., a binary "1") only if all of the StartUpOk signals have been asserted. The assertion of SysStartUpOk indicates that each direct-connected parallel power converter has traversed the startup state successfully. The assertion of SysStartUpOk can optionally be used to synchronize the transition of each power converter in the system to full power steady-state operation.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements.

DETAILED DESCRIPTION

Figure 1A:
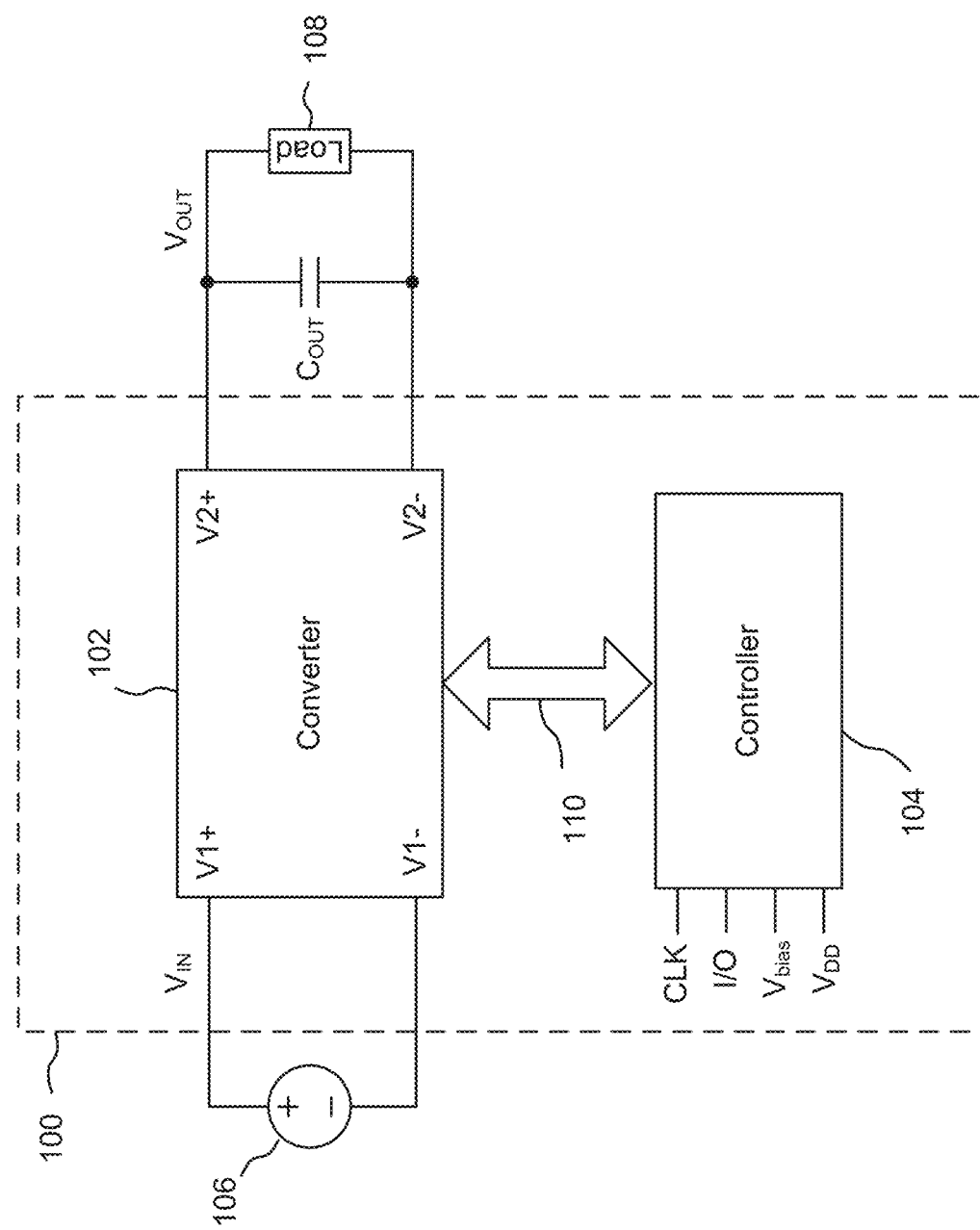
FIG. 1A is a block diagram of a circuit that includes a prior art power converter.

The present invention encompasses circuits and methods for controlling the startup of multiple parallel power converters having directly coupled outputs that, among other things, prevents premature steady-state operation by any or all of the parallel power converters in order to avoid or minimize issues such as excessive in-rush current, switch over-stress within a power converter, and/or thermal dissipation.

General Embodiment

In general, the startup state for a power converter includes a "soft-start" period where the operation of the power converter is close to steady-state but with reduced or limited power/current delivery to the output. The soft-start period is particularly beneficial if there is a fault at startup. At some point during the soft-start state, the power converter evaluates whether to exit the soft-start state. If startup was evaluated to have occurred successfully, then the power converter transitions from the soft-start state to the steady-state where full power delivery can begin. Otherwise, the power converter may choose to shut down or to transition to an intermediate cool-down state before re-entering soft-start and trying to start up again.

Prior art power converters generally rely primarily on measuring that an output voltage (e.g., $V_{OUT}$ and/or $V_X$) has reached a regulation target within a predefined tolerance (e.g., 80%) as the criteria for exiting the soft-start period. This is a simple, area-efficient, and cost-effective approach since most power converters already include circuitry for monitoring the output voltage $V_{OUT}$ during steady-state operation. However, as described above, it was realized that reliance upon measuring an output voltage as the sole criteria for concluding the soft-start period may not be sufficiently reliable for direct-connected parallel power converters having directly coupled outputs. Further, it was realized that inserting extra switches in series between the respective outputs of the power converters and the load node LN to control when a power converter was coupled to other power converters would increase power losses during steady-state operation.

With these realizations in mind, one aspect of exemplary embodiments of the present invention is the introduction of node status detectors coupled to selected nodes within some or all parallel-connected power converters 100_x to monitor voltage and/or current, and configured in some embodiments to work in parallel with an output status detector measuring the output voltage of an associated power converter 100_x during startup. For power converters that include a charge pump, the node status detectors ensure that the pump capacitors of each power converter 100_x are being adequately charged while the output capacitor $C_{OUT}$ is charged as well. In such embodiments, the soft-start period of startup may be considered finished if both the shared output capacitors and the pump capacitors of each power converter 100_x are charged to a selected percentage of the target steady-state values. Note that, in general, the measured output voltage will be $V_{OUT}$. However, in power converter circuits that include some circuit elements (e.g., an inductor) between the immediate output $V_X$ of the charge pump 120 and the ultimate output voltage $V_{OUT}$ of the power converter 100, the measured output voltage may be the immediate output $V_X$, before the added circuitry. For the sake of brevity through the rest of this disclosure, "$V_{OUT}$" will be referenced to include both cases unless specifically noted otherwise.

Figure 2:
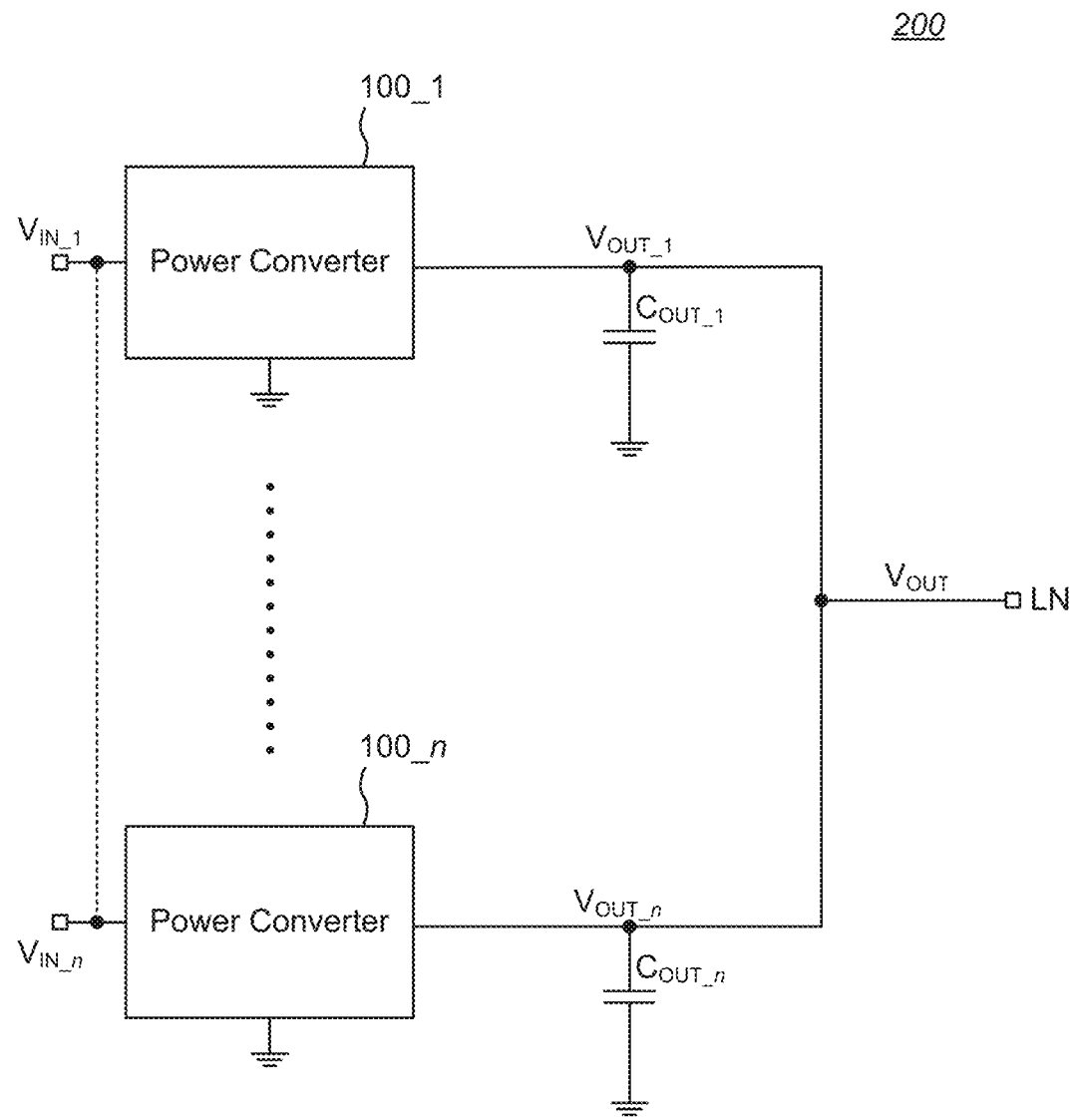
FIG. 2 is a block diagram of a circuit that includes multiple parallel-connected prior art power converters.
Figure 3:
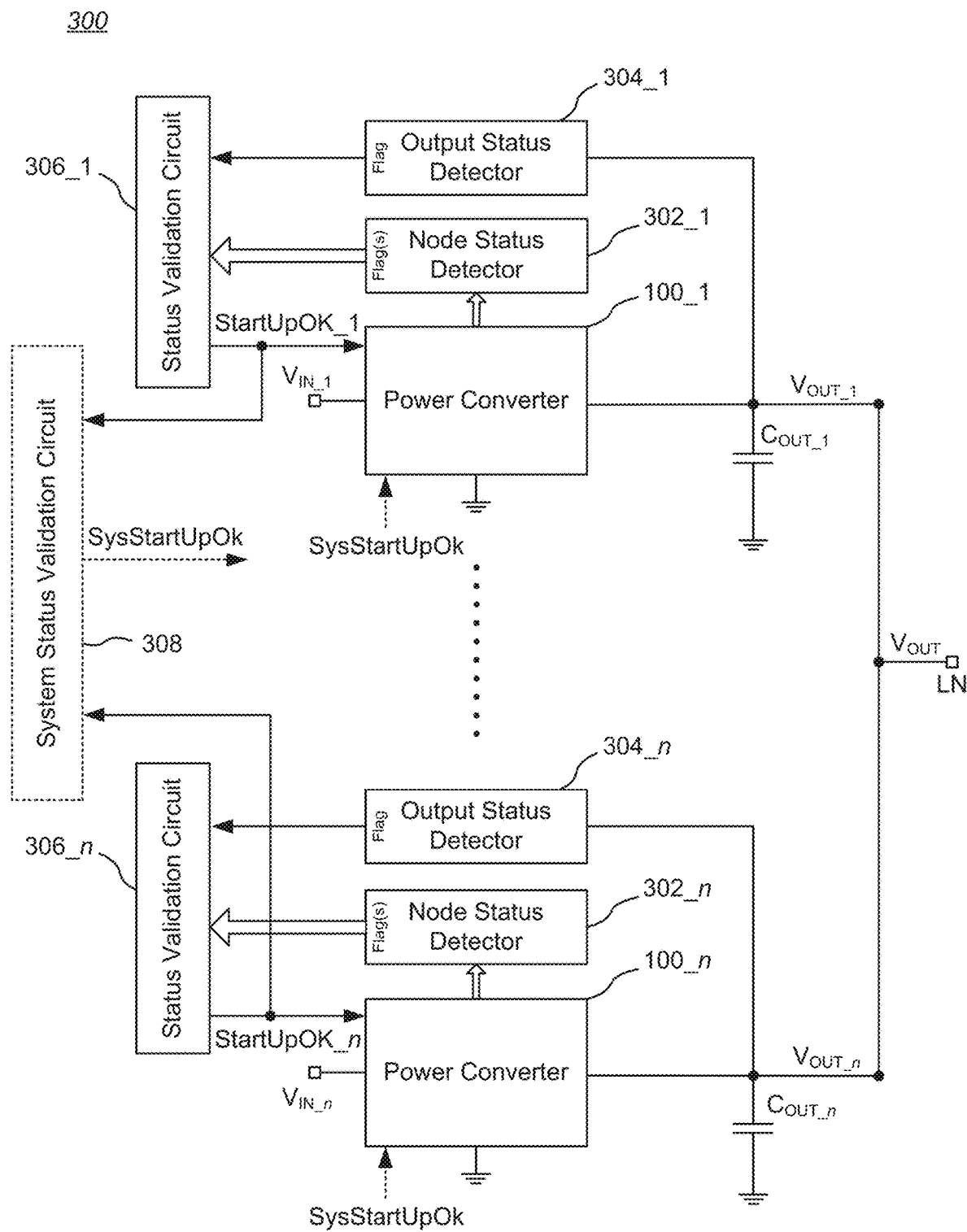
FIG. 3 is a block diagram of a circuit that includes multiple parallel-connected switched-capacitor power converters coupled to associated node status detectors and output status detectors.

FIG. 3 is a block diagram of a circuit 300 that includes multiple parallel-connected power converters 100_1 ... 100_n coupled to associated node status detectors 302_1 ... 302_n and output status detectors 304_1 ... 304_n. As illustrated, the circuit 300 is similar to the circuit 200 of FIG. 2 where an input voltage $V_{IN}$_x is applied to each of the n power converters 100_x, which each generate a corresponding output voltage $V_{OUT}$_x across respective output capacitors $C_{OUT}$_x when enabled for operation. Like FIG. 2, the $V_{OUT}$_x outputs of the power converters 100_x are shared (i.e., directly connected together at a load node LN). The $V_{IN}$_x inputs to the power converters 100_x can come from different voltage sources, or may be shared across one or more of the power converters 100_x (e.g., simply connected together to a single voltage source). Each node status detector 302_x is coupled to one or more internal nodes of an associated power converter 100_x to measure a voltage and/or current at such nodes to determine if the internal nodes or components of the power converter 100_x are adequately charged during the soft-start period. In addition, as illustrated, an optional output status detector 304_x may be coupled to the output voltage $V_{OUT}$_x of an associated power converter 100_x to measure the output voltage to determine if the output capacitor $C_{OUT}$_x is adequately charged during the soft-start period.

The node status detectors 302_x are configured to generate one or more node Flag signals if the measured voltage(s) or current(s) at the internal node(s) is sufficient to allow startup to proceed through to full power steady-state operation. Similarly, the output status detectors 304_x are configured to generate an output Flag signal if the measured output voltage $V_{OUT}$_x is sufficient to allow startup to proceed through to full power steady-state operation. In some embodiments, the functions of the node status detector 302_x and the output status detector 304_x may be incorporated within the controller 104 (shown in FIG. 1A) for each power converter 100_x. In other embodiments, the node status detector 302_x and the output status detector 304_x for each power converter 100_x may be a stand-alone circuit.

The output and node Flag signals shown in FIG. 3 are coupled to an associated status validation circuit 306_1 ... 306_n, each corresponding to a respective power converter 100_1 ... 100_n. The status validation circuits 306_x may be implemented, for example, as an AND gate that generates a logic StartUpOK_x signal (e.g., a binary "1") only if all of the Flag signals from the node status detector 302_x and the output status detector 304_x (if present) have been asserted, thus indicating that the respective output capacitor $C_{OUT}$_x and the internal nodes or components within each power converter 100_x are charged to a selected percentage of the target steady-state values (obviously, the opposite logic state for the StartUpOK_x signal, such as a binary "0", indicates that the selected charge level has not been reached). Each StartUpOK_x signal is shown coupled to an associated power converter 100_x, and thus may be taken into account as one required condition before enabling the associated power converter 100_x to complete the startup state and proceed through to full steady-state operation. The status validation circuits 306_x also may be implemented, for example, as a latched logic element that generates a latched logic StartUpOK_x signal once all of the Flag signals from the node status detector 302_x and the output status detector 304_x have been asserted during the startup state only. This then frees up the node status detector 302_x and the output status detector 304_x to be used for other monitoring purposes in other states of operation such as steady-state. As should be clear, other well-known circuits may be used to tally that the Flag signals from the node status detector 302_x and the output status detector 304_x (if present) of a corresponding power converter 100_x have all been asserted and, in response, generate a corresponding StartUpOK_x signal. In some embodiments, the functions of each status validation circuit 306_x may be incorporated within the controller 104 (shown in FIG. 1A) for each power converter 100_x. In other embodiments, each status validation circuit 306_x may be a stand-alone circuit.

The criteria for assertion of the StartUpOK signal by a status validation circuit 306_x based on the received Flag signals from the node status detectors 302_x and output status detectors 304_x may include (but not be limited to) whether the output voltage $V_{OUT}$ of an associated power converter 100_x was within a predefined tolerance value of its regulation target value (usually looser than the steady-state accuracy), whether or not other faults occurred during soft-start period, and/or whether converter internal node voltages or currents are within expected targets.

FIG. 3 also illustrates an optional configuration (as shown by dotted lines) in which each StartUpOK_x signal is coupled to a system status validation circuit 308. The system status validation circuit 308 may be implemented, for example, as an AND gate that generates a logic SysStartUpOK signal (e.g., a binary "1") only if all of the StartUpOk signals have been asserted (obviously, the opposite logic state for the SysStartUpOK_x signal, such as a binary "0", indicates that not all of the StartUpOk signals have been asserted). Accordingly, the assertion of the SysStartUpOk signal indicates that each power converter 100_x has traversed the startup state successfully. In the illustrated example, the SysStartUpOk signal is coupled to each power converter 100_x, and thus the assertion of the SysStartUpOk signal can optionally be used to synchronize the transition of each power converter 100_x in the system to full power steady-state operation. In some embodiments, the functions of the system status validation circuit 308 may be incorporated within the controller 104 (shown in FIG. 1A) for each power converter 100_x. In other embodiments, the system status validation circuit 308 may be a stand-alone circuit.

Figure 1B:
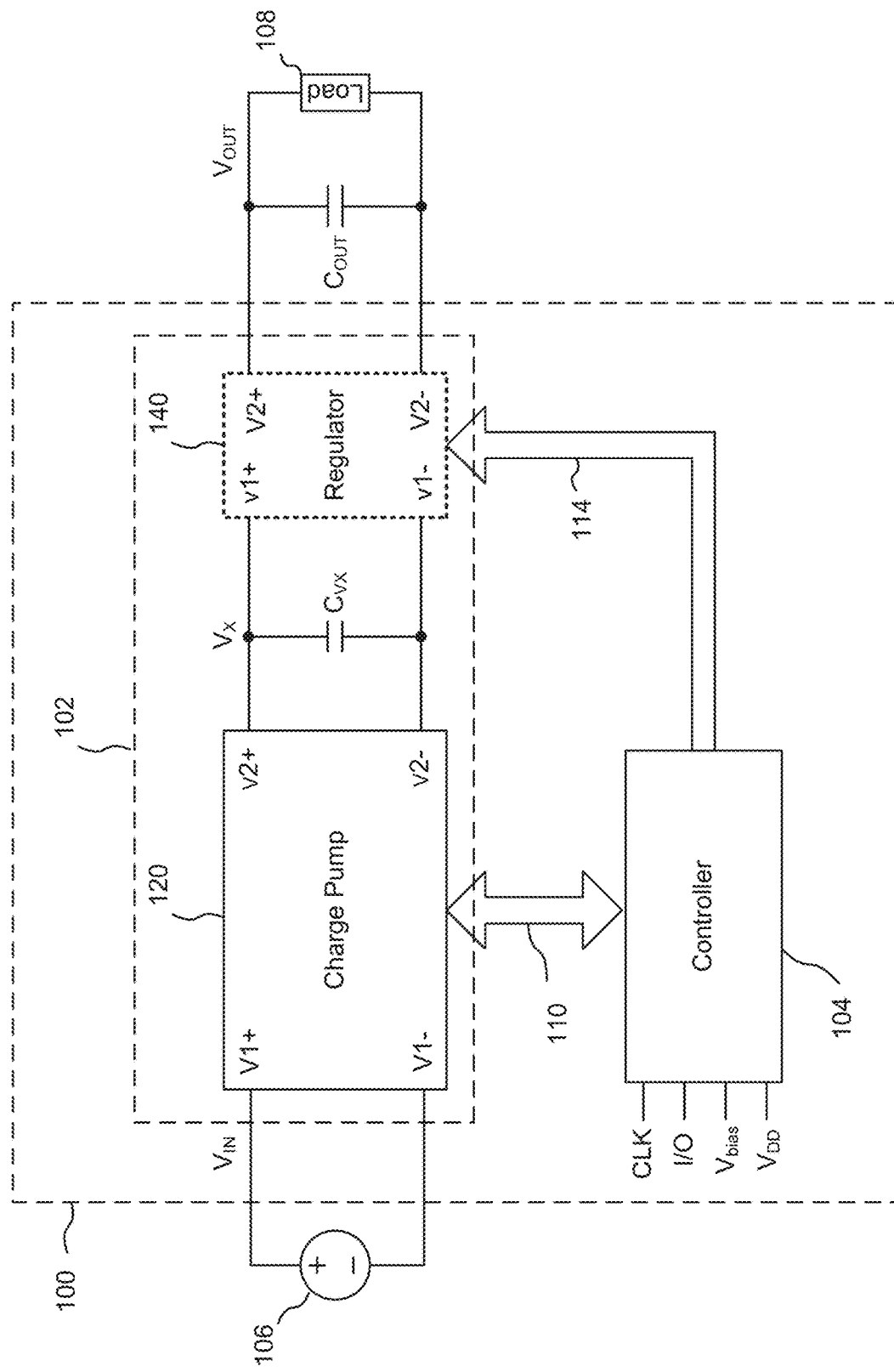
FIG. 1B is a block diagram of a circuit that includes a more detailed embodiment of an instance of the prior art power converter of FIG. 1A.
Figure 1C:
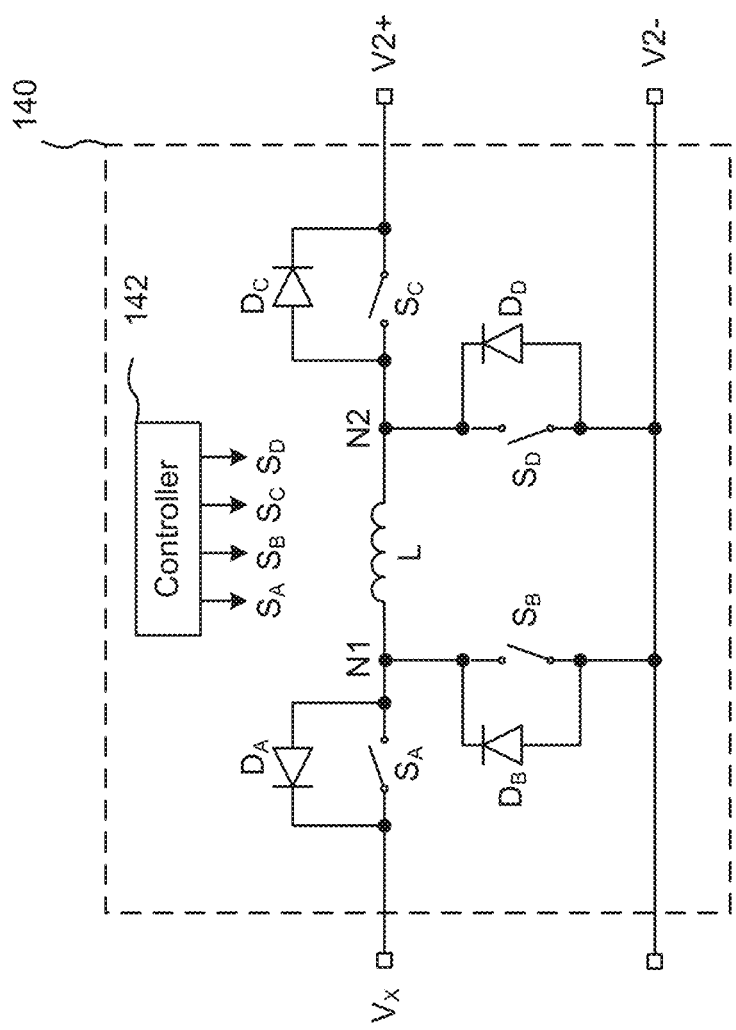
FIG. 1C is a schematic diagram of an embodiment of a prior art voltage regulator having an inductor L and controller to control one or more switches Sx within the voltage regulator.

In various embodiments, startup of the direct-connected parallel power converters 100_x can be concurrent or sequential or randomized (e.g., need-based, as when only some power converters 100_x are needed to provide power to other circuitry during a particular time). Note also that the converter circuit 102 (see FIG. 1) of the power converters 100_x need not be identical types or instances, although it would be common for the converter circuit 102 to be all the same type if the primary purpose of the direct-connected parallel power converters 100_x is increased power delivery.

Cascade Multiplier Embodiments

Figure 4A:
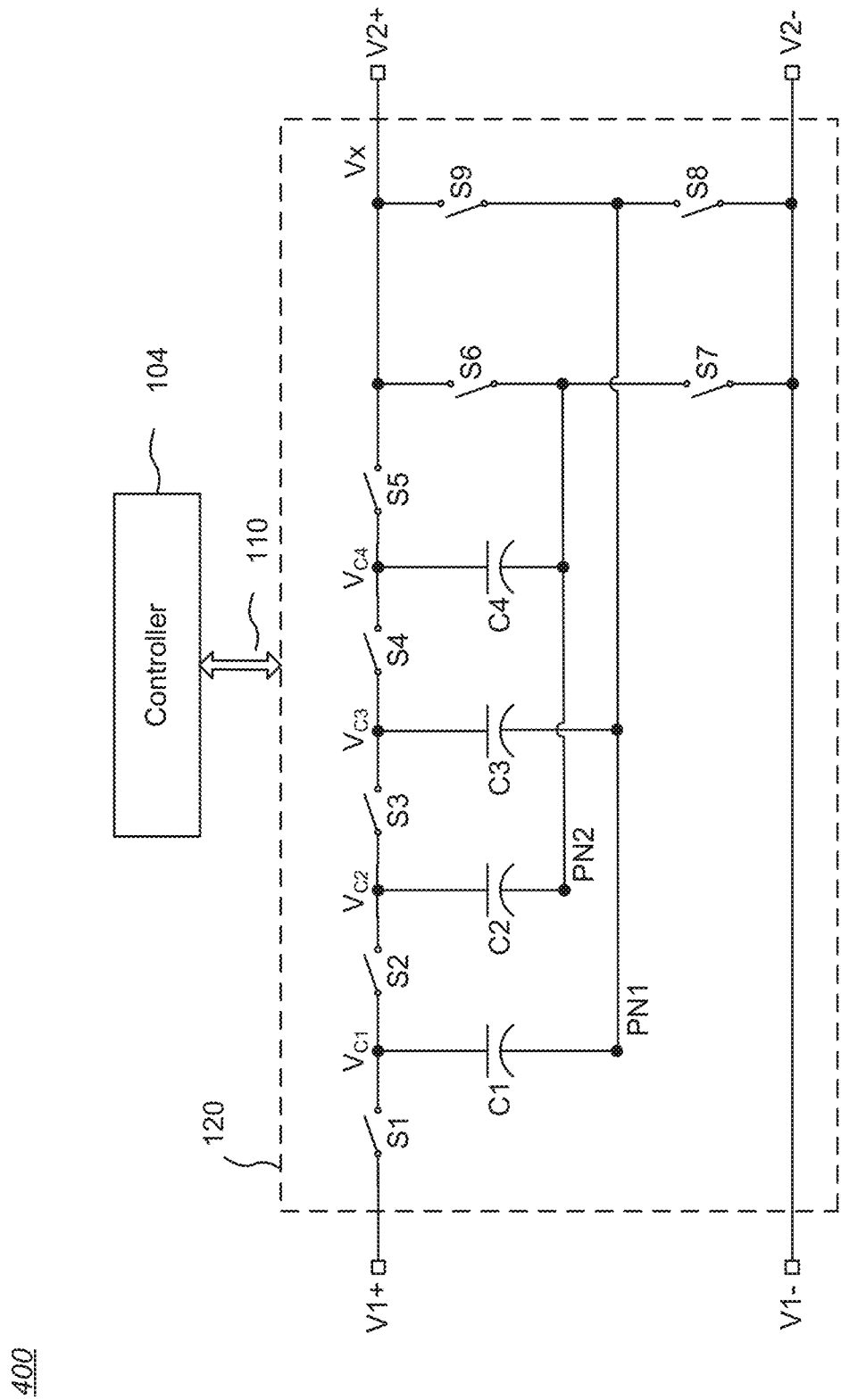
FIG. 4A is a schematic diagram of one embodiment of a charge pump comprising a single-phase symmetric cascade multiplier that may be used within one or more of the parallel power converters of FIG. 3.

The principles described above regarding node status detectors and status validation logic may be even better understood by reference to specific example embodiments. For example, FIG. 4A is a schematic diagram 400 of one embodiment of a charge pump 120 comprising a single-phase symmetric cascade multiplier that may be used within one or more of the parallel power converters 100_x of FIG. 3. The illustrated charge pump 120 is configured to receive an input voltage (e.g., $V_{IN}$) at terminals V1+, V1−, and transform the input voltage into an output voltage (e.g., $V_{OUT}$) at terminals V2+, V2−. A cascade multiplier is a switched-capacitor network that can provide a high conversion gain. As used in this disclosure, conversion gain represents (1) a voltage gain if the switched-capacitor network produces an output voltage that is larger than the input voltage ($V_{OUT} > V_{IN}$), or (2) a current gain if the switched-capacitor network produces an output voltage that is smaller than the input voltage ($V_{IN} > V_{OUT}$). Energy is transferred from the input to the output by cycling the cascade multiplier charge pump 120 through different topological states. Charge is transferred from the input voltage to the output voltage via a charge transfer path. The number and configuration of the capacitors in each topological state sets the conversion gain. The illustrated charge pump 120 would be controlled by a controller 104 in known fashion, as described above and as explained in greater detail in the U.S. Patent Application entitled "Shared Comparator for Charge Pumps" referenced above.

In the illustrated example, the charge pump 120 includes five series-connected switches S1-S5. The switches may be, for example, MOSFET switches—particularly N-type MOSFET switches—and each switch S1-S5 may comprise a stack of series-connected MOSFETs configured to function as a single switch. For convenience in discussing switching sequences, switches S1, S3, and S5 will sometimes be referred to collectively as the "odd switches" and switches S2 and S4 will sometimes be referred to collectively as the "even switches".

The charge pump 120 also includes first and second "low-side" phase switches S7, S8 and first and second "high-side" phase switches S6, S9. The low-side phase switches S7, S8 can connect first and second phase-nodes PN1, PN2 to the V2− terminal. The V1− terminal is typically connected to and thus shares the same voltage as the V2− terminal; however, in some embodiments the V1− and V2− terminals may not be directly connected and thus may have different voltages.

The high-side phase-switches S6, S9 can connect the first and second phase-nodes PN1, PN2 to the V2+ terminal. For convenience in discussing switching sequences, the high-side phase-switch S6 and the low-side phase-switch S8 will sometimes be referred to collectively as the "even phase-switches" and the low-side phase-switch S7 and the high-side phase-switch S9 will sometimes be referred collectively to as the "odd phase-switches."

A clock source in the controller 104 generates non-overlapping clock waveforms P1 and P2 that are coupled to and control the ON/OFF state of the various switches S1-S9, generally through level shifter and gate driver circuitry (not shown). In many embodiments, the illustrated charge pump 120 would be paired with a near-identical circuit, differing only in that the component switches would be operated on a different (generally 1800 opposite) phase.

A first pump capacitor C1 connects a first stack-node $V_{C1}$ between switches S1 and S2 to phase-node PN1. Similarly, a third pump capacitor C3 connects a third stack-node $V_{C3}$ between switches S3 and S4 to phase-node PN1. A second pump capacitor C2 connects a second stack-node $V_{C2}$ between switches S2 and S3 to phase-node PN2. Similarly, a fourth pump capacitor C4 connects a fourth stack-node $V_{C4}$ between switches S4 and S5 to phase-node PN2. A fifth stack-node, $V_X$, connects to the terminal V2+ of the charge pump 120.

The illustrated charge pump 120 has four stages. The first stage includes switch S1, first stack-node $V_{C1}$, and first pump capacitor C1; the second stage includes switch S2, second stack-node $V_{C2}$, and second pump capacitor C2; the third stage includes switch S3, third stack-node $V_{C3}$, and third pump capacitor C3; and the fourth stage includes switch S4, fourth stack-node $V_{C4}$, and fourth pump capacitor C4. A fifth series switch S5 connects the fourth stage to the fifth stack-node, $V_X$, which connects to terminal V2+.

Control signals from the controller 104 cause the series switches S1-S5, the low-side phase-switches S7, S8, and the high-side phase-switches S6, S9 to change states according to a specific sequence. As a result, the charge pump 120 repeatedly transitions between first and second operating states at a selected frequency. For example, during a first operating state defined by the P1 clock waveform having a logic "1" state and the P2 clock waveform having a logic "0" state, the controller 104 (1) closes the odd switches S1, S3, S5, the low-side phase switch S7, and the high-side phase switch S9, and (2) opens the even switches S2, S4, the high-side phase switch S6, and the low-side phase switch S8. During a second operating state defined by the P2 clock waveform having a logic "1" state and the P1 clock waveform having a logic "0" state, the controller 104 (1) opens the odd switches S1, S3, S5, the low-side phase switch S7, and the high-side phase switch S9, and (2) closes the even switches S2, S4, the high-side phase switch S6, and the low-side phase switch S8. The controller 104 controls and sequences transitions of all the switches S1-S9 in such a way as to incorporate any necessary dead-time needed when transitioning between the first and second operating states. As a consequence of alternating between the first operating state and the second operating state, charge is conveyed from terminals V1+, V1− to terminals V2+, V2−, in known fashion.

For the charge pump configuration of FIG. 4A, a node status detector 302_x (shown in FIG. 3) may be used to monitor the average voltage at one or more stack-nodes $V_{CX}$ and/or one or more phase-nodes PNx relative to $V_{IN}$ and/or $V_{OUT}$ to determine if the pump capacitors $C_X$ are adequately charged to a selected level during startup. Similarly, an output status detector 304_x may be used to monitor the average voltage at $V_X$ to determine if the output capacitor $C_{OUT}$ is adequately charged to a selected level during startup. An average voltage in excess of a selected reference level may indicate that the charge pump 120 has not yet caught up to the shared output voltage $V_{OUT}$ and/or that there is a fault within the charge pump 120, and thus that the particular power converter 100_x should not be transitioned to steady-state operation. Such node status detectors 302_x may comprise one of a variety of known circuits designed to monitor an average voltage.

In embodiments in which an inductor L is located between the $V_X$ output of a charge pump 120 and the $V_{OUT}$ output of a power converter 100_x, as described above, a node status detector 302_x may be used to monitor the voltage at one or more stack-nodes $V_{CX}$ (including $V_X$) to determine if the pump capacitors $C_X$ and the output capacitor $C_{OUT}$ are adequately charged to a selected level during startup. A voltage in excess of a selected reference level may indicate that the charge pump 120 has not yet caught up to the shared output voltage $V_{OUT}$ and/or that there is a fault within the charge pump 120, and thus that the particular power converter 100_x should not be transitioned to steady-state operation. Such node status detectors 302_x may comprise one of a variety of known circuits designed to monitor voltage.

In other embodiments, a current-sensing (rather than voltage sensing) node status detector may be used to monitor current through selected nodes of a power converter 100_x for reverse polarity and/or substantial magnitude. Current in excess of a selected reference level and/or having a polarity opposite of an expected level may indicate that the power converter 100_$x$ has not yet caught up to the shared output voltage $V_{OUT}$ and/or that there is a fault within the power converter 100_$x$, and thus that the particular power converter 100_$x$ should not be transitioned to steady-state operation. Such current sensing detectors are well-known in the art. The nodes that may monitored by a current-sensing node status detector may include one or more of the $V_X$ node, one or more stack-nodes $V_{CX}$, and/or one or more phase-nodes PNx. Such node status detectors 302_$x$ may comprise one of a variety of known circuits designed to monitor current.

As should be apparent, other measurements of voltage and/or current of the aforementioned nodes may be used to determine if the pump capacitors $C_X$ and the output capacitor $C_{OUT}$ are adequately charged to a selected level during startup. Such measurements may include any voltage or current characteristic associated with charging of the pump capacitors $C_X$ and the output capacitor $C_{OUT}$, for example voltage increments, voltage ripple, or current spikes, as long as they are directly associated with charging the pump capacitors $C_X$ and the output capacitor $C_{OUT}$.

Figure 4B:
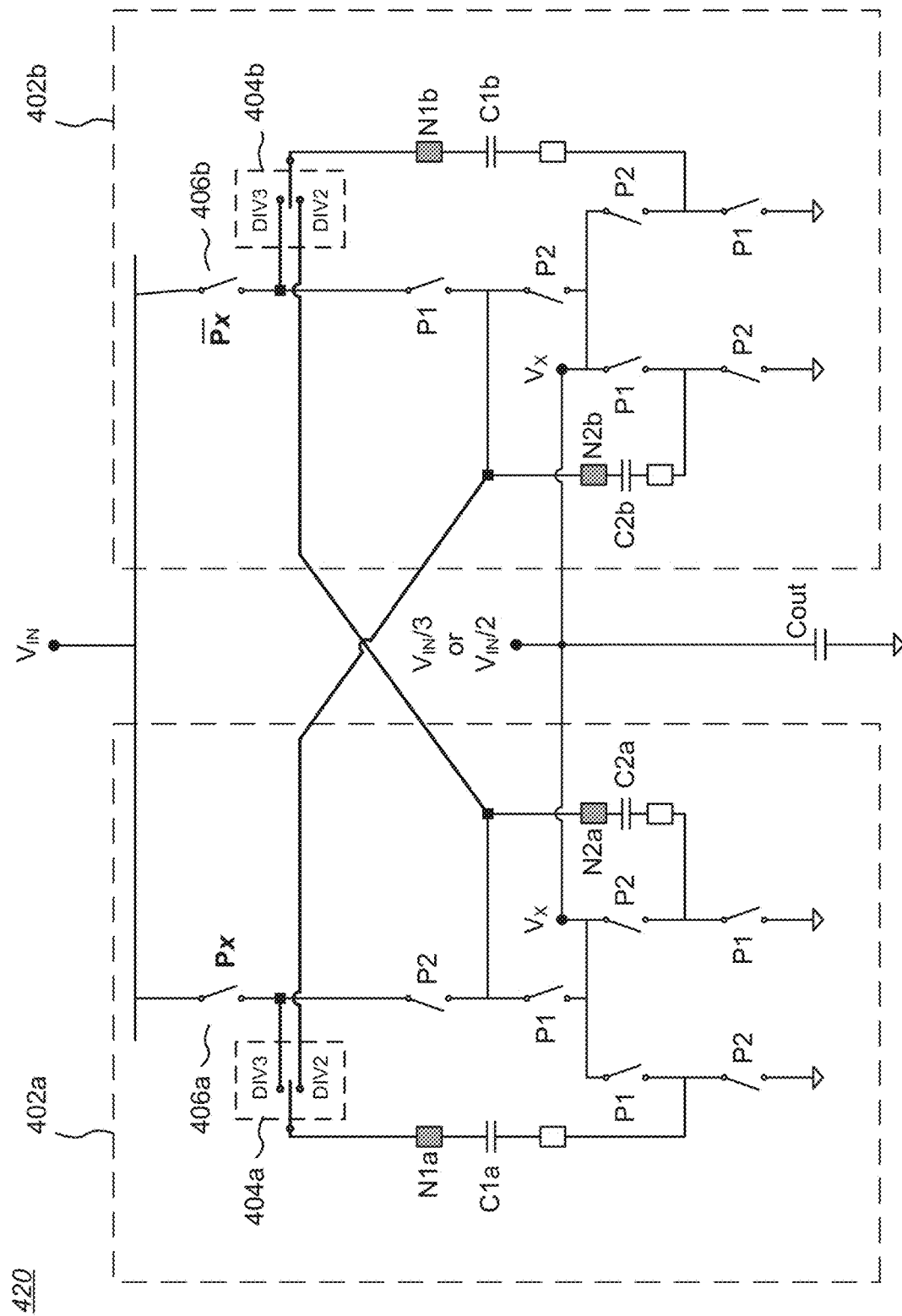
FIG. 4B is a schematic diagram of a selectable conversion ratio two-phase charge pump that may be used within one or more of the parallel power converters of FIG. 3.

As another example of a symmetric cascade multiplier, FIG. 4B is a schematic diagram of a selectable conversion ratio two-phase charge pump 420 that may be used within one or more of the parallel power converters 100_$x$ of FIG. 3. More specifically, the illustrated charge pump 420 may be selectably configured to be either a divide-by-2 or a divide-by-3 conversion ratio using the same basic circuit, as described in greater detail in U.S. Pat. No. 10,263,514 referenced above. However, it should be understood that the invention may be used in conjunction with charge pumps that have a fixed configuration, charge pumps with fewer or more phases, as well as with other charge pump types.

As shown, the layout of the array of switches controlled by clock signals P1 and P2 and of pump capacitors C1a, C2a, C1b, C2b is similar to a fixed divide-by-3 charge pump, except that each cell 402a, 402b includes a respective added configuration element 404a, 404b and alternative "DIV3" conductors and "DIV2" conductors. In addition, in cell 402a, the switch 406a directly coupled to $V_{IN}$ is controlled by a selectable clock signal, Px, while in complementary cell 402b, the switch 406b directly coupled to $V_N$ is controlled by the complement of the selectable clock signal, $\overline{Px}$.

When the configuration elements 404a, 404b are configured so as to couple a respective pump capacitor C1a, C1b to a corresponding DIV3 conductor, AND the phase of the clock signal Px is set to be the same as P1 in cell 402a and the phase of the complementary clock signal $\overline{Px}$ is set to be the same as P2 in cell 402b, then the charge pump 420 operates as a divide-by-3 charge pump circuit in exactly the same manner as a conventional fixed divide-by-3 charge pump circuit; thus, the immediate output $V_X$ of the charge pump 420 is $V_{in}/3$.

When the configuration elements 404a, 404b are configured so as to couple a respective pump capacitor C1a, C1b to a corresponding DIV2 conductor, those pump capacitors C1x are connected in parallel with the C2x pump capacitors of the other cell. Thus, in the illustrated example, pump capacitor C1a in cell 402a is coupled in parallel with pump capacitor C2b in cell 402b, while pump capacitor C1b in cell 402b is coupled in parallel with pump capacitor C2a in cell 402a. Further, in the DIV2 configuration, the phase of the clock signal Px is set to be the same as P2 in cell 402a (rather than P1, as in the DIV3 configuration), and the phase of the complementary clock signal $\overline{Px}$ is set to be the same as P1 in cell 402b (rather than P2, as in the DIV3 configuration). As so configured, the parallel arrangement of two pump capacitors (e.g., C1a and C2b, or C1b and C2a) effectively forms a single equivalent pump capacitor and thereby eliminates having a second independent pump capacitor in each cell 402a, 402b of the charge pump 420. Accordingly, the charge pump 420 operates as a divide-by-2 converter circuit in exactly the same manner as a conventional fixed divide-by-2 charge pump circuit; thus, the immediate output $V_X$ of the charge pump 420 is $V_{IN}/2$.

In steady-state operation for the DIV3 configuration, the pump capacitors are charged to multiples of $V_X$ (which generally will be the same as $V_{OUT}$). For the pump capacitors shown in FIG. 4B, pump capacitors C1a and C1b will be charged to $2*V_X$, while pump capacitors C2a and C2b will be charged to $V_X$.

In steady-state operation for the DIV2 configuration, the pump capacitors are again charged to multiples of $V_X$. For the pump capacitors shown in FIG. 4B, pump capacitors C1a and C1b will be in parallel with pump capacitors C2a and C2b, and all pump capacitors will be charged to $V_X$.

More generally, if the conversion gain of the charge pump 420 is N, there will be (N−1) capacitors per clock phase, the maximum voltage across a capacitor will be (N−1)*$V_X$, and the minimum voltage across a capacitor will be $V_X$.

Of note in FIG. 4B are differential nodes N1a, N2a and differential nodes N1b, N2b associated with the "top" (with respect to $V_{IN}$) plates of the respective pump capacitors C1a, C2a, C1b, and C2b. Differential detector circuits coupled to pairs of these nodes can take advantage of the symmetry of the pump capacitor voltages for the cells 402a, 402b to determine if the respective pump capacitors are adequately charged with respect to $V_{OUT}$. For example, FIGS. 5A-5D show a set of circuit modules that provide the functionality of the node status detectors 302_$x$ and output status detectors 304_$x$.

Figure 5A:
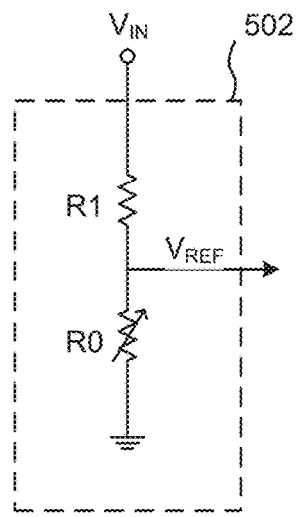
FIG. 5A is a schematic diagram of a reference voltage generator.

FIG. 5A is a schematic diagram of a reference voltage generator 502. The illustrated reference voltage generator 502 is a resistive voltage divider which generates a scaled reference voltage $V_{REF}$ from an applied input voltage $V_{IN}$ (which may be the same $V_{IN}$ applied to the charge pump 420 of FIG. 4B) as a function of the ratio of series-connected resistors R0 and R1: $V_{REF}=V_{IN}*(R0/(R0+R1))$. In some embodiments, the value of resistor R0 may be adjustable or settable, allowing some variability in the scaling ratio of $V_{REF}$ with respect to $V_{IN}$. As should be clear, other known circuits may be used to generate a reference voltage $V_{REF}$, such as a bandgap circuit, a reference current into a resistor, etc.

Figure 5B:
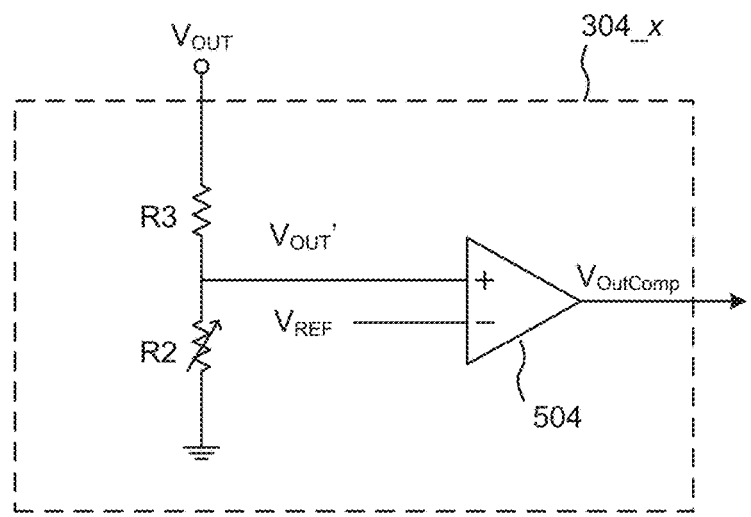
FIG. 5B is a schematic diagram of one example of an output status detector.

FIG. 5B is a schematic diagram of one example of an output status detector 304_$x$. Series-connected resistors R2 and R3 form a resistive voltage divider which generates a scaled voltage $V_{OUT}'$ from an applied output voltage $V_{OUT}$ from an associated power converter 100_$x$ as a function of the ratio of series-connected resistors R2 and R3. In some embodiments, the value of resistor R2 may be adjustable or settable, thus allowing some variability in the scaling ratio of $V_{OUT}'$ with respect to $V_{OUT}$, which is particularly useful for providing variability to allow for different or a wide range of conversion gain ratios (e.g., both the DIV2 and DIV3 configurations of the charge pump 420 of FIG. 4B). The scaled voltage $V_{OUT}'$ is applied to a first input of a comparator 504. A second input to the comparator 504 is the scaled reference voltage $V_{REF}$ from the reference voltage generator 502. The comparator 504 outputs an output flag signal $V_{Outcomp}$ if $V_{OUT}'$ approximately equals or is greater than $V_{REF}$ (small discrepancies may occur due to slight differences in components and signal paths within the comparator 504). Since $V_{REF}$ and/or $V_{OUT}'$ may be adjustable or settable, a tolerance can be set as to whether $V_{OUT}$ (and hence $V_{OUT}'$) is considered to have reached a selected target value, thereby generating the output flag signal $V_{OutComp}$. As should be clear, other types of comparison or measurement circuits could be used in lieu of the output status detector 304_x illustrated in FIG. 5B. However, beneficially, the illustrated circuit is simple to implement.

Figure 5C:
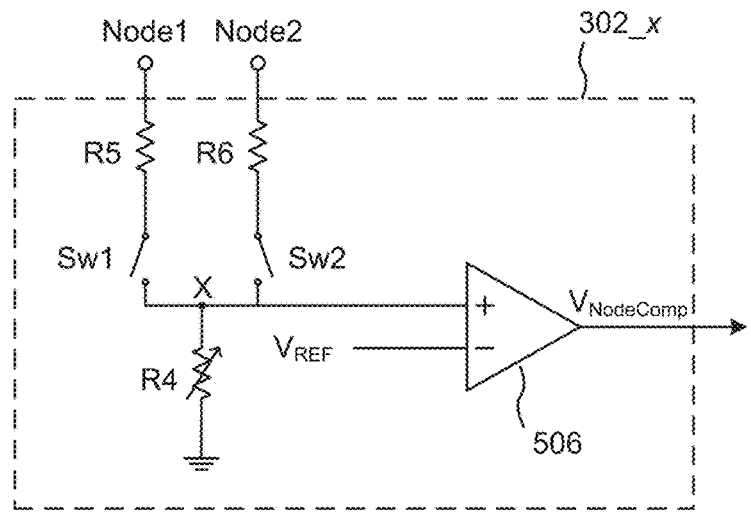
FIG. 5C is a schematic diagram of a node status detector particularly adapted for use with the two-phase charge pump of FIG. 4B.

FIG. 5C is a schematic diagram of a node status detector 302_x particularly adapted for use with the two-phase charge pump 420 of FIG. 4B. A voltage divider network comprises a shunt resistor R4 series coupled to parallel resistors R5 and R6. Resistors R5 and R6 are respectively coupled to same-stage node pairs from the charge pump 420 (e.g., N1a and N1b, or N2a and N2b). In some embodiments, the value of resistor R4 may be adjustable or settable, which is particularly useful for providing variability to allow for different or a wide range of conversion gain ratios (e.g., both the DIV2 and DIV3 configurations of the charge pump 420 of FIG. 4B). As should be clear, other types of voltage divider circuits may be used in lieu of the illustrated voltage divider network. However, beneficially, the illustrated circuit is simple to implement.

In the illustrated embodiment, a node X between the shunt resistor R4 and the parallel resistors R5 and R6 is coupled to a first input of a comparator 506. A second input to the comparator 506 is the scaled reference voltage $V_{REF}$ from the reference voltage generator 502. The comparator 506 outputs a node flag signal $V_{NodeComp}$ if the voltage at node X approximately equals or is greater than $V_{REF}$. In this case, the voltage at node X equals a scaled-and-summed version of the differential voltages applied at the Node1 and Node2 inputs. Switches Sw1 and Sw2 allow the node status detector 302_x to be decoupled from the charge pump 420 when not in use. As should be clear, other types of comparison or voltage measurement circuits could be used in lieu of the node status detector 302_x illustrated in FIG. 5C. However, beneficially, the illustrated circuit is simple to implement.

For a charge pump 420 with conversion gain N, there would be (N−1) instances of the node status detector 302_x. Thus, for example, for a DIV3 configuration of the two-phase charge pump 420 of FIG. 4B having a conversion gain of N=3, Node1 and Node2 of a first instance of the node status detector 302_x would be coupled to differential nodes N1a and N1b, and Node1 and Node2 of a second instance of the node status detector 302_x would be coupled to differential nodes N2a and N2b. For a charge pump with a conversion gain N and a number of phases m where m≥1, the number of node status detectors 302_x can still be (N−1) if the number of NodeX inputs to each node status detector 302_x equals m. Referring to the FIG. 5C embodiment, an m number of NodeX inputs would each couple to a series connection of a switch SwX and resistor R_X, sharing the same shunt resistor and node X. In this case, the voltage at node X equals a scaled-and-summed version of the voltages applied at each NodeX input.

Figure 5D:
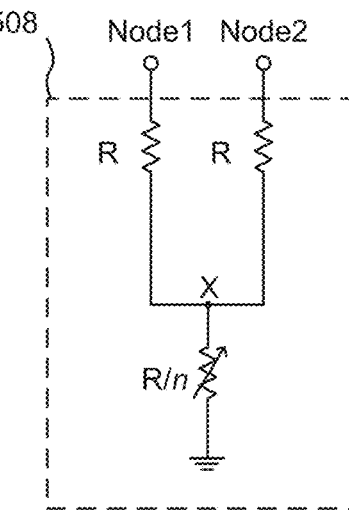
FIG. 5D is an equivalent circuit schematic of the voltage divider network of FIG. 5C.

FIG. 5D is an equivalent circuit schematic 508 of the voltage divider network of FIG. 5C where the resistors coupled to the differential Node1 and Node2 inputs have the same resistance value R, while the shunt resistor from node X to circuit ground has a resistance value scaled from R by a factor of 1/n. In this case, the voltage at node X is the sum of the voltages at Node1 and Node2 divided by (2+n). If the value of n is much smaller than 2, then the voltage at node X approaches the average of the differential voltages at Node1 and Node2. Therefore, the circuit of FIG. 5D can be used to generate an output voltage representing the average of two input voltages, with the value of n selected to adjust the scaling factor applied to this average as needed to accommodate the charge pump conversion gain ratio, the criteria for soft-start or startup completion, etc.

For symmetric cascade multipliers in general, an advantage of the differential node status detector 302_x of FIG. 5C is that it makes use of the stage symmetry of the voltages on the "top" plate nodes of the pump capacitors across multiple phases of switching to generate a scaled-average of the differential voltages. The scaled-average voltage generated at node X can be compared to the $V_{REF}$ reference voltage derived from $V_{IN}$. For example, for a DIV3 configuration of the charge pump 420 of FIG. 4B, depending on the clock phase, the top plate voltage of pump capacitors C1a and C1b will toggle between $3*V_X$ and $2*V_X$ differentially, so their scaled-average voltage will be proportional to $5*V_X$, while the top plate voltage of pump capacitors C2b and C2a will toggle between $2*V_X$ and $V_X$ differentially, so their scaled-average voltage will be proportional to $3*V_X$. As a another example, for a DIV2 configuration of the charge pump 420 of FIG. 4B, depending on the clock phase, the top plate voltage of pump capacitors C1a and C1b will toggle between $2*V_X$ and $V_X$ differentially, so their scaled-average voltage will be proportional to $3*V_X$, while the top plate voltage of pump capacitors C2b and C2a will toggle between $2*V_X$ and $V_X$ differentially, so their scaled-average voltage will also be proportional to $3*V_X$.

It should be appreciated that the node status detectors 302_x of FIG. 3 is just an example of a circuit suitable for differential cases, and that other differential circuits may be utilized. Further, in alternative embodiments, single-ended voltage detection circuits may be used for the node status detectors 302_x of FIG. 3 (see the description below with respect to FIGS. 5E and 5F).

Figure 6:
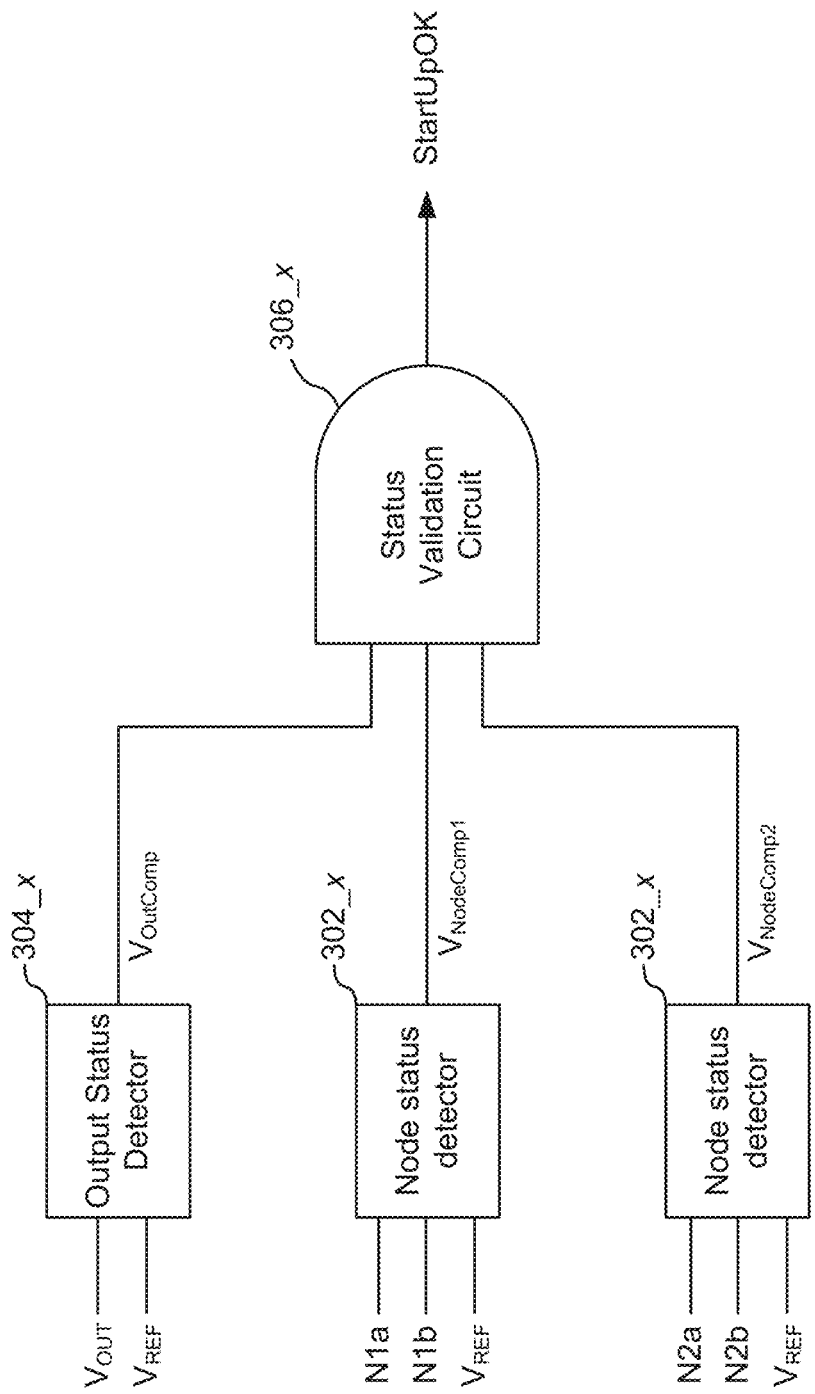
FIG. 6 is a block diagram showing an output status detector (from FIG. 5B) and two instances of a node status detector (from FIG. 5C) coupled to a status validation circuit.

FIG. 6 is a block diagram showing an output status detector 304_x (from FIG. 5B) and two instances of a node status detector 302_x (from FIG. 5C) coupled to a status validation circuit 306_x. In the illustrated example, the status validation circuit 306_x is implemented as an AND gate that generates a logic "1" StartUpOK signal only if all of the flag signals ($V_{OutComp}$, $V_{NodeComp1}$, and $V_{NodeComp2}$) from the node status detector 302_x and the output status detector 304_x indicate that the output capacitor $C_{OUT}$ and the pump capacitors of a charge pump 420 are charged to a selected percentage of the target steady-state values. The StartUpOK signal may be taken into account as one required condition in determining whether to transition the associated charge pump 420 from the startup state and proceed through to full power steady-state operation, such as by disabling any startup-state limitation or reduction in output power delivery.

Variations and Benefits of Embodiments of the Invention

In some embodiments, combinations of the above-described node status detectors 302_x may be used in conjunction with the converter circuits 102 of a set of parallel-connected power converters 100_x; that is, the type of node status detector 302_x may vary among the parallel-connected power converters 100_x.

In variant embodiments, the status validation circuits 306x may intercommunicate or interact with a controller (such as the controller 104 in FIG. 1) so that, for example, the issuance of StartUpOK_x flag signals is done concurrently or in a desired sequence in order to further control transitions of the individual power converters 100_x from startup to steady-state operation.

Further, the status validation circuits 306_x may be configured to take into account factors other than target capacitor charge values when issuing StartUpOK_x flag signals, such as a desired sequence for starting up the power converters 100_x. Other factors may include whether the output current of a power converter 100_x is negative (a factor that applies to both charge pump and voltage regulator power converters), or whether the node voltage is larger than a desired threshold (pertinent in particular to adiabatic charge pumps). Similarly, the system status validation circuit 308 may intercommunicate or interact with a controller (such as the controller 104 in FIG. 1) so that, for example, the issuance of the SysStartUpOK flag signal takes into account factors other than the individual StartUpOk_x flag signals.

One alternative type of node status detector 302_x would be a conventional sample-and-hold circuit coupled to one or more nodes to be monitored. The sample-and-hold circuit may be configured to periodically sample the voltage or current at a coupled node or nodes only during specific times, such as between the clock signals P1 and P2 or during only a specific portion of such clock signals. For example, this would allow monitoring time-varying node values at peaks and/or troughs, rather than summing multiple nodes to obtain an average value.

Figure 5E:
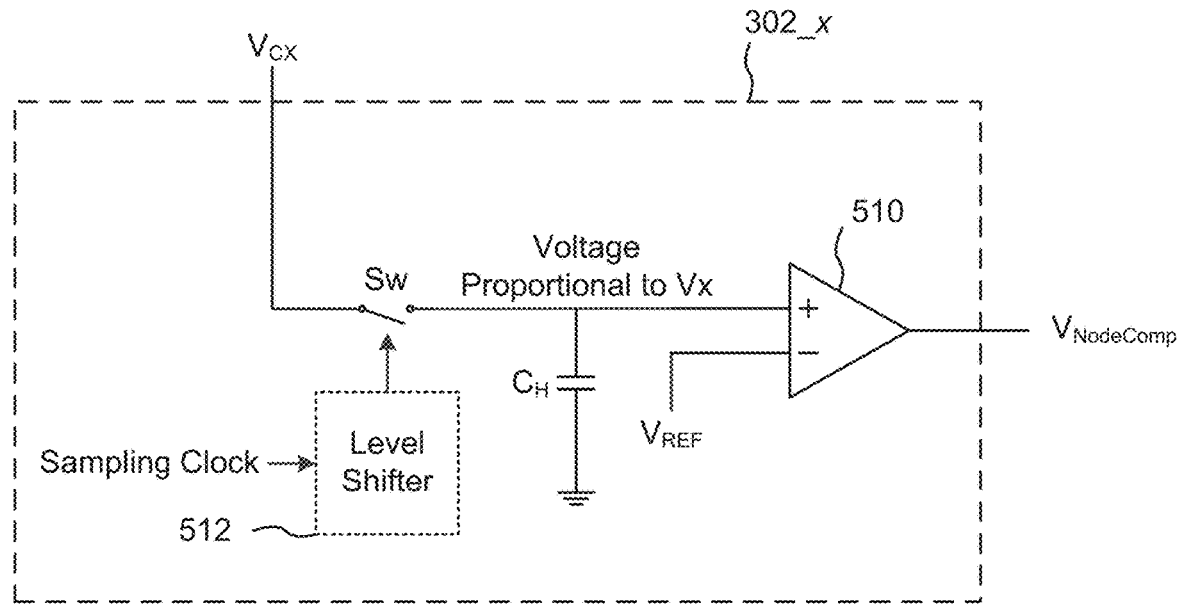
FIG. 5E is a block diagram of an example embodiment of a node status detector based on a sample-and-hold circuit.

FIG. 5E is a block diagram of an example embodiment of a node status detector 302_x based on a sample-and-hold circuit. In the illustrated example, the voltage at a stack-node $V_{CX}$ (which may include the $V_X$ node) is applied to the input of a switch Sw, which, when closed, couples the applied voltage to a holding capacitor CH and a first input of a comparator 510. A second input to the comparator 510 is a scaled reference voltage $V_{REF}$, such as from the reference voltage generator 502 in FIG. 5A. Periodically, the switch Sw is opened under the control of a Sampling Clock signal and the sampled-and-held voltage on the holding capacitor CH is compared to $V_{REF}$. The comparator 510 outputs a node flag signal $V_{NodeComp}$ if the voltage at the coupled node approximately equals or is greater than $V_{REF}$. The Sampling Clock signal may need to pass through a Level Shifter 512 (shown in dotted outline) to be able to sample voltages from the higher voltage $V_{CX}$ node. Of note, the node status detector 302_x of FIG. 5E is a single-ended voltage detection circuit.

For any $V_{CX}$ node n being sampled, the voltage at node n will vary between two integer multiples of $V_X$, $nV_X$ and $(n-1)V_X$. Ideally, the sampling should be done when $V_{CX}$ at node n reaches the maximum voltage $nV_X$ at node n to better represent the voltage reached across the corresponding capacitor. In addition, the phase-node (e.g., PN1 or PN2 in FIG. 4A) associated with a stack-node $V_{CX}$ being measured should be pulled down to circuit ground (for example, by a switch, not shown) so that the sampled voltage is the voltage across the associated pump capacitor $C_X$.

Figure 5F:
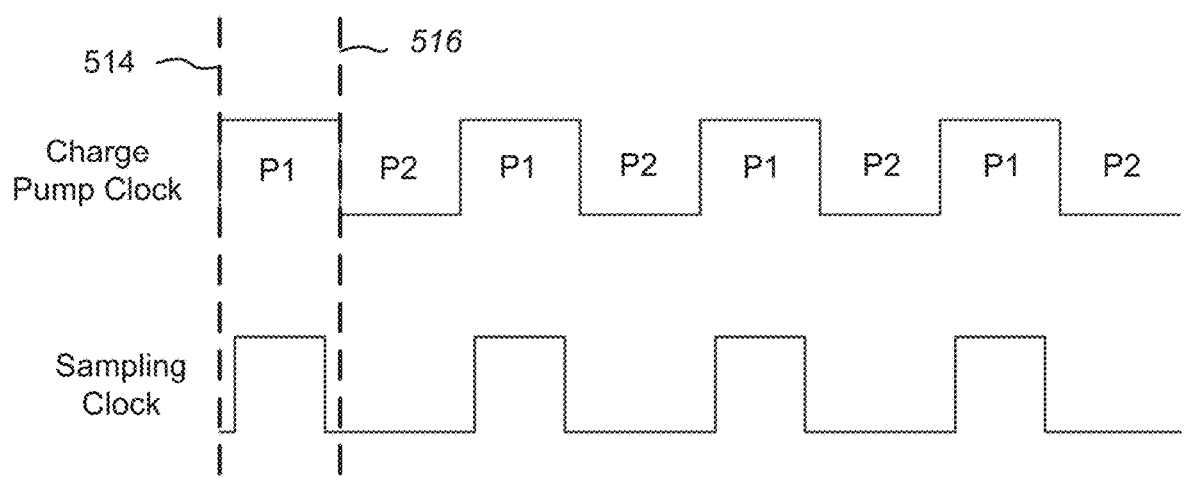
FIG. 5F is a set of timing diagrams showing one possible relationship of the Sampling Clock signal of FIG. 5E compared to a two-phase Charge Pump Clock.

FIG. 5F is a set of timing diagrams showing one possible relationship of the Sampling Clock waveform of FIG. 5E compared to a two-phase Charge Pump Clock. As illustrated, the Sampling Clock signal should have a pulse-width that fits within the pulse-width of the selected Charge Pump Clock phase, as indicated by dotted lines 514 and 516. Sampling need only happen during one of the Charge Pump Clock phases, preferably the phase with the higher voltage at the sampled $V_{CX}$ node (e.g., phase P1).

Other examples of circuits that may be used as a sample-and-hold node status detector 302_x can be found in U.S. patent application Ser. No. 16/783,800, referenced above.

Advantages of various embodiments of the invention include one or more of the following:

avoidance of the problem of damaging in-rush current and/or switch over-stress in an added power converter in a set of parallel power converters without needing performance-degrading isolation switches in series between the respective $V_{OUT}$ outputs of the power converters and the load node LN;

more accurate startup detection for directly-connected parallel power converters to protect against one or more fault events within a power converter during startup, thereby avoiding the problem of damaging in-rush current and/or switch over-stress;

more accurate startup detection for parallel charge pumps to protect against fault conditions such as faulty pump capacitors or output capacitors or other charge pump circuitry during startup, thereby avoiding the problem of damaging in-rush current and/or switch over-stress;

for some charge pump types, simplicity of node status detector implementation by using the stage symmetry of pump capacitor switching nodes to average the voltage for comparison against a reference voltage;

avoidance of over-voltage stress and/or over-current stress on charge pump nodes (particularly important when a charge pump is implemented as an integrated circuit solution using low-voltage transistor switches, especially MOSFET switches); and/or avoidance of power waste and/or thermal issues, since a power converter that is still in the soft-start period potentially shunts current away from the power converter output while one or more other power converters that have transitioned out of the soft-start period work to prop up the shared output $V_{OUT}$.

Methods

Figure 7:
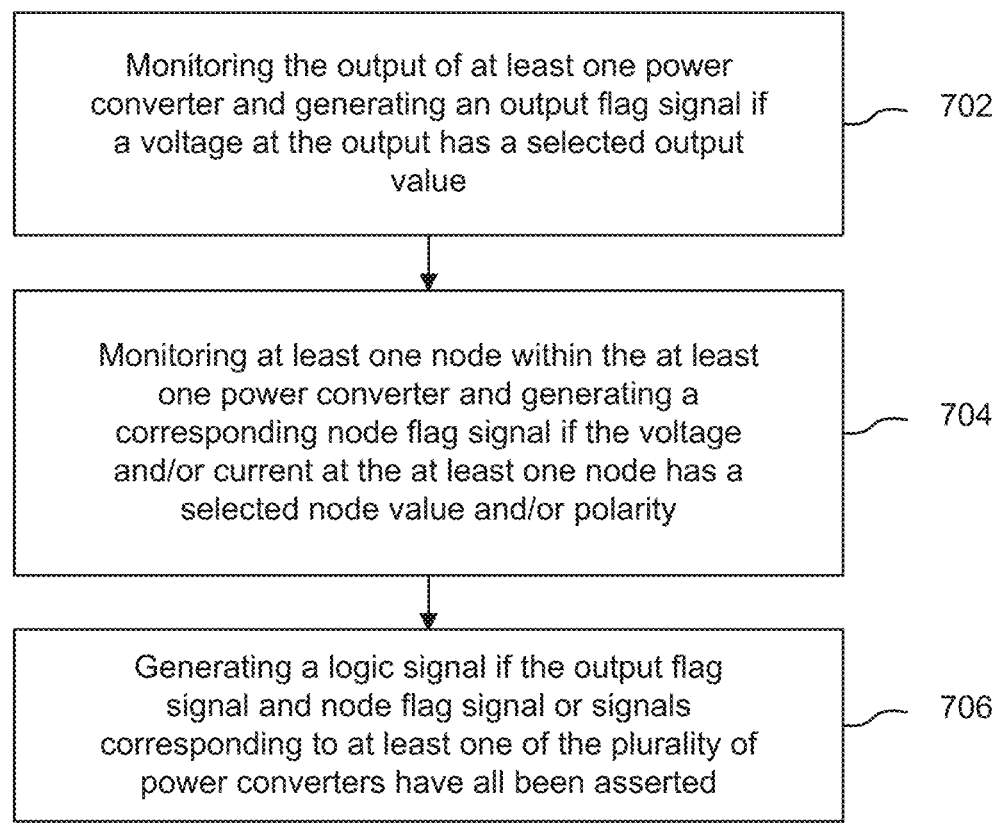
FIG. 7 is a process flow chart showing a first method for startup detection for a plurality of parallel power converters having direct-connected outputs.

Another aspect of the invention includes methods of startup detection for a plurality of parallel power converters having direct-connected outputs. For example, FIG. 7 is a process flow chart 700 showing a first method for startup detection for a plurality of parallel power converters having direct-connected outputs. The method includes: monitoring the output of at least one power converter and generating an output flag signal if the voltage at the output is within a desired percentage of a corresponding target steady-state output value (Block 702); monitoring at least one node within the at least one power converter and generating a corresponding node flag signal if the voltage and/or current at the at least one node has a desired node value and/or polarity (Block 704); and generating a logic signal if the output flag signal and node flag signal or signals corresponding to at least one of the plurality of power converters have all been asserted (Block 706).

Figure 8:
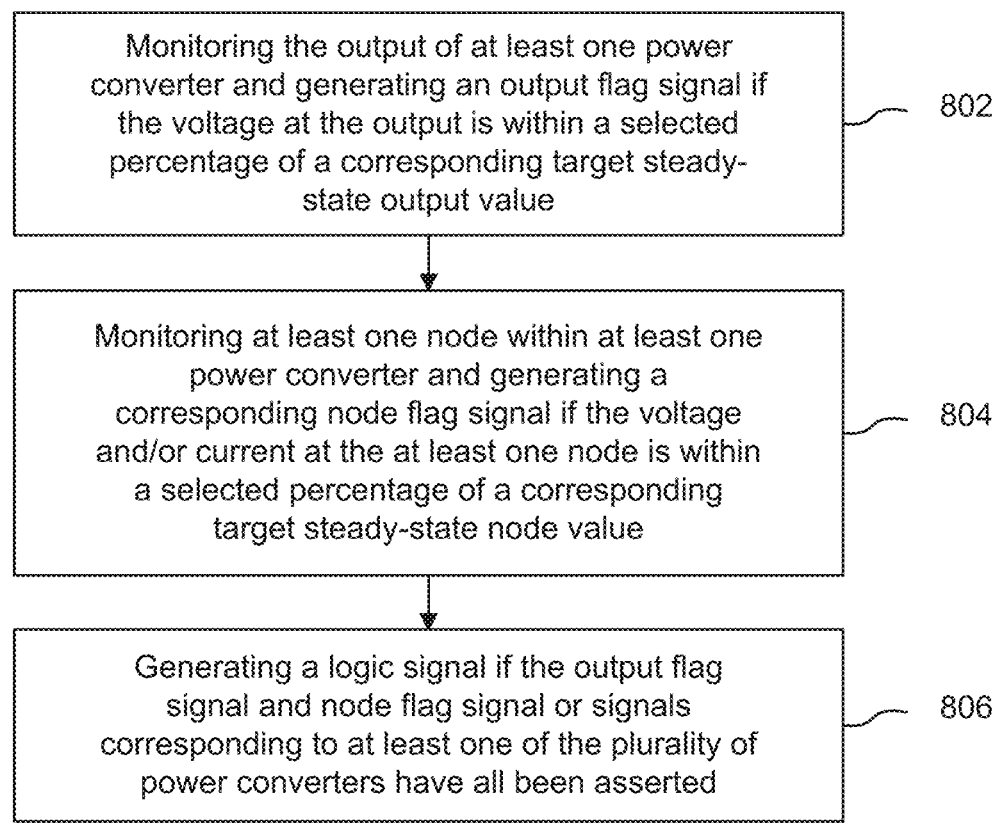
FIG. 8 is a process flow chart showing a second method for startup detection for a plurality of parallel power converters having direct-connected outputs.

As another example, FIG. 8 is a process flow chart 800 showing a second method for startup detection for a plurality of parallel power converters having direct-connected outputs. The method includes: monitoring the output of at least one power converter and generating an output flag signal if a voltage at the output has a selected output value (Block 802); monitoring at least one node within at least one power converter and generating a corresponding node flag signal if the voltage and/or current at the at least one node is within a selected percentage of a corresponding target steady-state node value (Block 804); and generating a logic signal if the output flag signal and node flag signal or signals corresponding to at least one of the plurality of power converters have all been asserted (Block 806).

Figure 9:
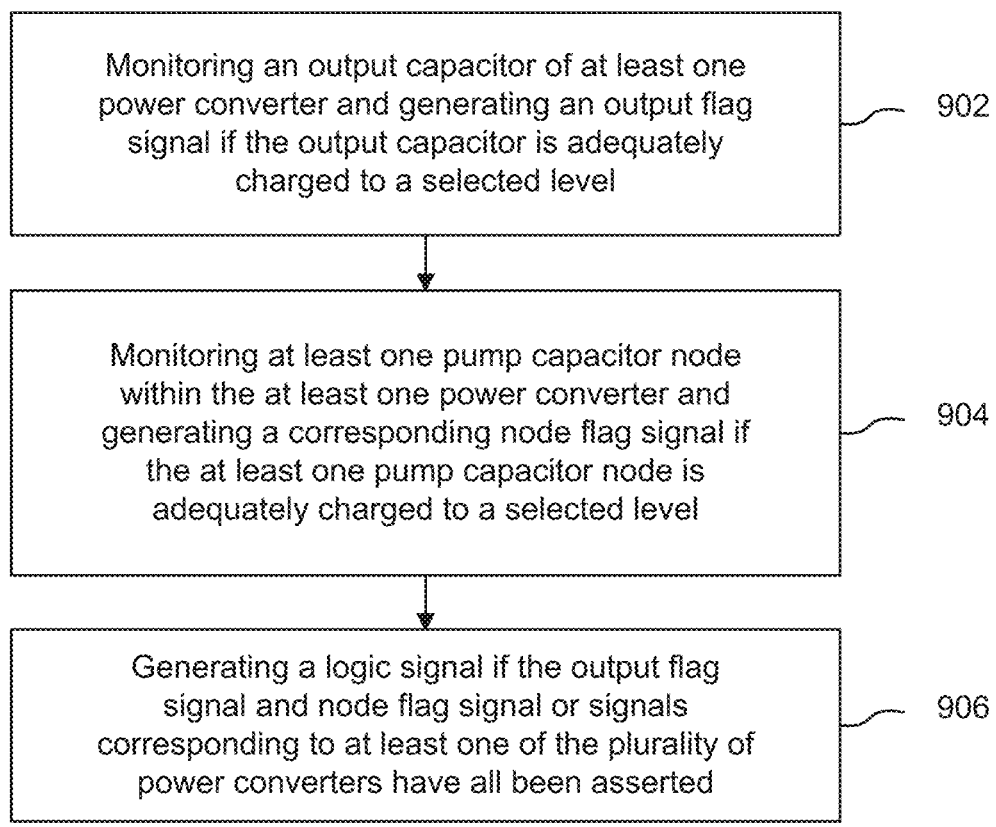
FIG. 9 is a process flow chart showing a third method for startup detection for a plurality of parallel power converters having direct-connected outputs.

As yet another example, FIG. 9 is a process flow chart 900 showing a third method for startup detection for a plurality of parallel power converters having direct-connected outputs. The method includes: monitoring an output capacitor of at least one power converter and generating an output flag signal if the output capacitor is adequately charged to a selected level (Block 902); monitoring at least one pump capacitor node within the at least one power converter and generating a corresponding node flag signal if the at least one pump capacitor node is adequately charged to a selected level (Block 904); and generating a logic signal if the output flag signal and node flag signal or signals corresponding to at least one of the plurality of power converters have all been asserted (Block 906).

Additional aspects of the above methods may include enabling at least one power converter to transition to a steady-state mode of operation in response to receipt of the logic signal.

Fabrication Technologies & Options

Note that while the node status detector 302_x circuits above have been described in the context of startup detection, they may also be used to continuously monitor the stack-nodes $V_{CX}$, as well as $V_X$ and/or $V_{OUT}$. This may be useful, for example, to detect fault conditions after start up, generating an $V_{OUTCOMP}$ value that may be used as an interrupt signal when, for example, the voltage at a monitored node falls below or exceeds a selected value. Thus, a power converter may be transitioned out of a steady-state mode of operation (for example, to a startup mode) in response to receipt of at least the $V_{OUTCOMP}$ signal from one or more node status detector 302_x circuits indicative of a fault event (e.g., voltage and/or current too low or too high).

The term "MOSFET", as used in this disclosure, includes any field effect transistor (FET) having an insulated gate whose voltage determines the conductivity of the transistor, and encompasses insulated gates having a metal or metal-like, insulator, and/or semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

Various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, silicon-on-insulator (SOI), and silicon-on-sapphire (SOS). Unless otherwise noted above, embodiments of the invention may be implemented in other transistor technologies such as bipolar, LDMOS, BCD, GaAs HBT, GaN HEMT, GaAs pHEMT, and MESFET technologies. However, embodiments of the invention are particularly useful when fabricated using an SOI or SOS based process, or when fabricated with processes having similar characteristics. Fabrication in CMOS using SOI or SOS processes enables circuits with low power consumption, the ability to withstand high power signals during operation due to FET stacking, good linearity, and high frequency operation (i.e., radio frequencies up to and exceeding 50 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

Circuits and devices in accordance with the present invention may be used alone or in combination with other components, circuits, and devices. Embodiments of the present invention may be fabricated as integrated circuits (ICs), which may be encased in IC packages and/or in modules for ease of handling, manufacture, and/or improved performance. In particular, IC embodiments of this invention are often used in modules in which one or more of such ICs are combined with other circuit blocks (e.g., filters, amplifiers, passive components, and possibly additional ICs) into one package. The ICs and/or modules are then typically combined with other components, often on a printed circuit board, to form an end product such as a cellular telephone, laptop computer, or electronic tablet, or to form a higher level module which may be used in a wide variety of products, such as vehicles, test equipment, medical devices, etc. Through various configurations of modules and assemblies, such ICs typically enable a mode of communication, often wireless communication.

CONCLUSION

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. A detection circuit configured to be coupled to a plurality of parallel power converters having direct-connected outputs, the detection circuit including (1) a system status validation circuit coupled to each of the plurality of parallel power converters, and (2) for each of the parallel power converters:

(a) at least one node status detector each coupled to a corresponding node of the parallel power converter and configured to assert a corresponding node flag signal if the voltage and/or current at the corresponding node has a selected node value;

(b) an output status detector coupled to the output of the parallel power converter and configured to assert an output flag signal if a voltage at the output has a selected output value; and (c) an associated status validation circuit coupled to the system status validation circuit and configured to receive the node flag signal from the at least one node status detector and the output flag signal from the output status detector, and to assert a logic signal to the system status validation circuit if all of the received flag signals have been asserted;

wherein the system status validation circuit is configured to prevent the plurality of parallel power converters from transitioning to a steady-state mode of operation in the absence of receipt of the asserted logic signal from all of the associated status validation circuits.

2. The invention of claim 1, wherein the system status validation circuit is configured to cause the plurality of parallel power converters to transition to the steady-state mode of operation in response to receipt by the system status validation circuit of at least the asserted logic signal from all of the associated status validation circuits.

3. The invention of claim 1, wherein at least one parallel power converter is configured to transition out of the steady-state mode of operation in response to receipt of at least the logic signal from the associated status validation circuit.

4. The invention of claim 1, wherein at least one of the parallel power converters includes a switched-capacitor power converter.

5. The invention of claim 4, wherein the switched-capacitor power converter includes a plurality of switches coupled in series, and at least one of the plurality of switches is coupled to an associated node status detector.

6. The invention of claim 1, wherein at least one of the parallel power converters includes a symmetric cascade multiplier charge pump.

7. The invention of claim 1, wherein the at least one node status detector includes:

(a) a voltage divider network configured to receive input voltages from same-stage node pairs within the associated parallel power converter and output a scaled sum of the input voltages; and (b) a comparison circuit, coupled to the output of the voltage divider network and to a reference voltage, configured to assert the corresponding node flag signal if the voltage at the corresponding node has a selected node value.

8. A detection circuit configured to be coupled to a plurality of parallel power converters having direct-connected outputs, including, for each of the parallel power converters:

(a) at least one node status detector each coupled to a corresponding node of the parallel power converter and configured to assert a corresponding node flag signal if the voltage and/or current at the corresponding node is within a selected percentage of a corresponding target steady-state node value, wherein the at least one node status detector includes:

(1) a voltage divider network configured to receive input voltages from same-stage node pairs within the parallel power converter and output a scaled sum of the input voltages; and (2) a comparison circuit, coupled to the output of the voltage divider network and to a reference voltage, configured to assert the corresponding node flag signal if the voltage at the corresponding node has a selected node value;

(b) an output status detector coupled to the output of the parallel power converter and configured to assert an output flag signal if the voltage at the output is within a selected percentage of a corresponding target steady-state output value; and (c) an associated status validation circuit coupled to the parallel power converter, the output status detector, and the at least one node status detector, the associated status validation circuit configured to receive the output flag signal from the output status detector and the corresponding node flag signal from the at least one node status detector and assert a logic signal if all of the received flag signals have been asserted;

wherein the plurality of parallel power converters are prevented from transitioning to a steady-state mode of operation in the absence of receipt of the asserted logic signal from all of the associated status validation circuits;

wherein the plurality of parallel power converters are configured to transition to a steady-state mode of operation in response to receipt of at least the asserted logic signal from all of the associated status validation circuits; and wherein at least one parallel power converter is configured to transition out of a steady-state mode of operation in response to receipt of at least the logic signal from the associated status validation circuit.

9. The invention of claim 8, wherein at least one of the parallel power converters includes a switched-capacitor power converter.

10. The invention of claim 8, wherein at least one of the parallel power converters includes a symmetric cascade multiplier charge pump.

11. A detection circuit configured to be coupled to a plurality of parallel power converters having direct-connected outputs, including, for each of the parallel power converters:

(a) at least one node status detector each coupled to a corresponding pump capacitor node of the parallel power converter and configured to assert a corresponding node flag signal if the corresponding pump capacitor node is adequately charged to a selected level, wherein the at least one node status detector includes:

(1) a voltage divider network configured to receive input voltages from same-stage node pairs within the parallel power converter and output a scaled sum of the input voltages; and (2) a comparison circuit, coupled to the output of the voltage divider network and to a reference voltage, configured to assert the corresponding node flag signal if the voltage at the corresponding node has a selected node value;

(b) an output status detector coupled to an output capacitor of the parallel power converter and configured to assert an output flag signal if the output capacitor is adequately charged to a selected level; and (c) an associated status validation circuit coupled to the parallel power converter, the output status detector, and the at least one node status detector, the status validation circuit configured to receive the output flag signal from the output status detector and the corresponding node flag signal from the at least one node status detector and provide a logic signal to the parallel power converter if all of the received flag signals have been asserted;

wherein the plurality of parallel power converters are configured to transition to a steady-state mode of operation in response to receipt of at least the logic signal from all of the associated status validation circuits; and wherein at least one parallel power converter is configured to transition out of a steady-state mode of operation in response to receipt of at least the logic signal from the associated status validation circuit.

12. The invention of claim 11, wherein at least one of the parallel power converters includes a charge pump.

13. The invention of claim 11, wherein at least one of the parallel power converters includes a symmetric cascade multiplier charge pump.

14. The invention of claim 11, wherein each parallel power converter is enabled to transition to the steady-state mode of operation in response to receipt of at least the logic signal from the corresponding status validation circuit and the plurality of parallel power converters are prevented from transitioning to the steady-state mode of operation in the absence of receipt of the logic signal from all of the status validation circuits.

15. The invention of claim 14, wherein at least one of the plurality of parallel power converters includes a switched-capacitor power converter.

16. The invention of claim 14, wherein at least one of the plurality of parallel power converters includes a symmetric cascade multiplier charge pump.

17. The invention of claim 11, wherein the same-stage nodes pairs are same-stage symmetric pump capacitor node pairs.

\* \* \* \* \*